US008533545B2

(12) United States Patent
Goyal et al.

(10) Patent No.: US 8,533,545 B2
(45) Date of Patent: Sep. 10, 2013

(54) METHOD AND APPARATUS FOR SYSTEM TESTING USING MULTIPLE INSTRUCTION TYPES

(75) Inventors: Suresh Goyal, Warren, NJ (US); Michele Portolan, Dunsany (IE); Bradford Van Treuren, Lambertville, NJ (US)

(73) Assignee: Alcatel Lucent, Paris (FR)

( * ) Notice: Subject to any disclaimer, the term of this patent is extended or adjusted under 35 U.S.C. 154(b) by 715 days.

(21) Appl. No.: 12/495,237

(22) Filed: Jun. 30, 2009

(65) Prior Publication Data

US 2010/0229036 A1    Sep. 9, 2010

Related U.S. Application Data

(60) Provisional application No. 61/157,412, filed on Mar. 4, 2009.

(51) Int. Cl.
*G01R 31/28* (2006.01)

(52) U.S. Cl.
USPC ............................ 714/726; 714/738; 714/742

(58) Field of Classification Search
None
See application file for complete search history.

(56) References Cited

U.S. PATENT DOCUMENTS

| 5,694,399 A | 12/1997 | Jacobson et al. |
| 5,828,579 A | 10/1998 | Beausang |
| 6,061,709 A | 5/2000 | Bronte |
| 6,195,774 B1 * | 2/2001 | Jacobson ...................... 714/727 |
| 6,370,664 B1 | 4/2002 | Bhawmik |
| 6,453,456 B1 | 9/2002 | Price |
| 6,640,322 B1 | 10/2003 | Schulz |
| 6,832,359 B2 | 12/2004 | Abe et al. |
| 6,957,371 B2 | 10/2005 | Ricchetti et al. |
| 7,047,462 B2 | 5/2006 | Brown et al. |
| 7,073,110 B1 | 7/2006 | Jacobson et al. |
| 7,089,404 B1 | 8/2006 | Rozas et al. |
| 7,139,950 B2 | 11/2006 | Huisman et al. |

(Continued)

FOREIGN PATENT DOCUMENTS

| JP | 11282717(A) | 10/1999 |
| JP | 2004-280588 | 10/2004 |

OTHER PUBLICATIONS

Marinissen, E.; et al.; , "On IEEE P1500's Standard for Embedded Core Test", Journal of Electronic Testing: Theory and Applications (JETTA), vol. 18, No. 4/5, pp. 365-383, Aug. 2002.*

(Continued)

*Primary Examiner* — Ajay Bhatia
*Assistant Examiner* — Daniel McMahon
(74) *Attorney, Agent, or Firm* — Wall & Tong, LLP

(57) ABSTRACT

An apparatus for use in testing at least a portion of a system under test via a Test Access Port (TAP) is provided. The apparatus includes a memory for storing a set of instructions of a test instruction set architecture and a processor executing the set of instructions of the test instruction set architecture for testing at least a portion of the system under test via the TAP. The set of instructions of the test instruction set architecture includes a first set of instructions including a plurality of instructions of an Instruction Set Architecture (ISA) supported by the processor and a second set of instructions including a plurality of test instructions associated with the TAP. The instructions of the first set of instructions and the instructions of the second set of instructions are integrated to form the set of instructions of the test instruction set architecture.

20 Claims, 23 Drawing Sheets

(56) References Cited

U.S. PATENT DOCUMENTS

| | | | |
|---|---|---|---|
| 7,149,943 | B2 | 12/2006 | Van Treuren et al. |
| 7,467,342 | B2 | 12/2008 | Ricchetti et al. |
| 7,539,915 | B1 | 5/2009 | Solt |
| 7,661,049 | B2 | 2/2010 | Whetsel |
| 2002/0010886 | A1 | 1/2002 | Tanaka et al. |
| 2002/0124216 | A1 | 9/2002 | Blasco et al. |
| 2003/0163773 | A1* | 8/2003 | O'Brien et al. ............... 714/726 |
| 2004/0059437 | A1 | 3/2004 | Cullen et al. |
| 2004/0199927 | A1 | 10/2004 | Liu et al. |
| 2004/0222305 | A1 | 11/2004 | Leaming |
| 2004/0225917 | A1 | 11/2004 | Doing et al. |
| 2005/0166092 | A1 | 7/2005 | Swoboda |
| 2005/0210345 | A1 | 9/2005 | Bybell |
| 2006/0236176 | A1 | 10/2006 | Alyamani |
| 2008/0201497 | A1 | 8/2008 | Ooi |
| 2008/0281547 | A1 | 11/2008 | Nakamura et al. |

OTHER PUBLICATIONS

The International Search Report and the Written Opinion of the International Searching Authority, Or the Declaration, in PCT/US2011/040420, Alcatel-Lucent USA Inc., Applicant, mailed Nov. 2, 2011, 12 pages.

Kuen-Jong Lee et al: "A unified test and debug platform for SOC design", ASIC, 2009. ASICON '09. IEEE 8$^{th}$ International Conference on, IEEE, Piscataway, NJ, USA, Oct. 20, 2009, pp. 577-580, XP031578951, ISBN: 978-1-4244-3868-6.

Hopkins A B T et al: "Debug support for complex systems on-chip: a review" IEE Proceedings: Computers and Digital Techniques, IEE, GB, vol. 153, No. 4, Jul. 3, 2006, pp. 197-207, XP006026744, Issn: 1350-2387.

IEEE Std. 1500, "IEEE Standard Testability Method for Embedded Core-based Integrated Circuits," IEEE Computer Society, Aug. 29, 2005, http:/grouper.ieee.org/groups/1500/.

P1687 homepage, http://grouper.ieee.org/groups/1687/, printed on Jan. 31, 2012.

Aeroflex Gaisler homepage, http://www.gaisler.com, printed on Jan. 31, 2012.

A.W. Ley, "Doing More With Less—An IEEE 1149.7 Embedded Tutorial: Standard for Reduced-pin and Enhanced-Functionality Test Access Port and Boundary-Scan Architecture," Proceedings of the 2009 International Test Conference (ITC 09), Austin, TX, 2009.

"JBits 3.0 SDK for Virtex-II," http://www.xilinx.com/labs/projects/jbits/, printed Feb. 9, 2010.

Xilinx Press Release #0396, "Xilinx Enables Reconfigurable Computing with Free JBits Software for Use with Virtex-II FPGAS," http://www.xilinx.com/prs_rls/end_markets/03108jbits.htm, printed Feb. 9, 2010.

E. Keller and S. McMillan, "An FPGA Wire Database for Run-Time Routers," Military and Aerospace Programmable Logic Devices (MAPLD) International Conference, 2002.

M. Portolan et al., "Scalable and Efficient Integrated Test Architecture," 2009 International Test Conference, Austin, Texas, Nov. 1-7, 2009 IEEE.

M. Portolan et al., "Test & Reliability: Preparing to the Next Step," Bell Labs Innovation Day, Dublin, Ireland, May 19-20, 2009.

"IEEE Standard Test Access Port and Boundary-Scan Architecture," IEEE Std. 1149.1-2001, IEEE, USA, 2001.

"Serial Vector Format Specification," ASSET InterTech, Inc. Revision E, Mar. 8, 1999.

EIA/JEDEC Standard, Standard Test and Programming Language (STAPL), JEDS71, Aug. 1999.

GDB: The GNU Project Debugger, http://www.gnu.org/softward/gdt/, printed Nov. 5, 2009.

R. N. Joshi et al., "Evolution of IEEE 1149.1 Addressable Shadow Protocol Devices," Proceedings of the 2003 International Test Conference (ITC03), vol. 1, pp. 981-987, Sep. 30-Oct. 2, 2003.

"The SPARC Architecture Manual, Version 8," SPARC International Inc., http://www.sparc.org/standards/_V8.pdf, 1992.

M. Portolan et al., "A New Language Approach for IJTAG," Proceedings of the 2008 International Test Conference (ITC 09), Santa Clara, California, Oct. 28-30, 2008.

S. Andersson, "The Design of a Master Test Controller for a System-Level Embedded Boundary-Scan Test Architecture," 4$^{th}$ International Workshop on Board Testing (BTW05), Nov. 2-4, 2005, pp. 1-24.

S. Andersson, "The Design of a Master Test Controller for a System-Level Embedded Boundary-Scan Test Architecture," 4$^{th}$ International Workshop on Board Testing (BTW05), Nov. 2-4, 2005, PowerPoint slides 1-21.

C. J. Clark and M. Ricchetti, "Infrastructure IP for Configuration and Test of Boards and Systems," IEEE Design & Test of Computers, vol. 20, No. 3, May-Jun. 2003.

P. Sundararajan et al., "Testing FPGA Devices Using JBits," Military and Aerospace Programmable Logic Devices (MAPLD) International Conference, Laurel, Maryland, Sep. 2001.

SN54LVT8980A, SN74LVT8980A, Embedded Test-Bus Controllers, IEEE STD 1149.1 (JTAG) Tap Masters with 8-bit Generic Host Interfaces, SCBS755B, Apr. 2002, Revised Mar. 2004, Texas Instruments.

"IEEE Standard for Module Test and Maintenance Bus (MTM-Bus) Protocol," IEEE Std 1149.5-1995.

Miranda, Jose M., Van Treuren, Bradford G., "Embedded Boundary-Scan Testing," Proceedings of the Board Test Workshop, 2002.

"ARM1136JF-S and ARM1136J-S, Revision: r1p5, Technical Reference Manual," Chapter 11, ARM DDI 0211K, Feb. 20, 2009.

"VFP11 Vector Floating-point Coprocessor for ARM1136JF-S Processor r1p5, Technical Reference Manual," ARM DDI 0274H, Jul. 6, 2007.

International Search Report and the Written Opinion of the International Searching Authority, Or the Declaration in PCT/US2010/026022, Alcatel-Lucent USA Inc., Applicant, mailed Jun. 18, 2010, 16 pages.

The International Search Report and the Written Opinion of the International Searching Authority, or the Declaration, in PCT/US2010/026072; Alcatel-Lucent USA Inc., Applicant; mailed Aug. 13, 2010; 17pages.

Multi-ICE Version 2.2, User Guide, ARM DUI 0048F, 1998-2002 ARM Limited.

Sep. 11, 2012 Office Action in EP 10 708 456.8, Alcatel Lucent, Applicant, 6 pages.

Japanese Office Action, Patent Application No. 2011-553067, Applicant (Alcatel-Lucent), Mar. 5, 2013, 3 pages.

Korean Notice of Preliminary Rejection, Patent Application No. 2011-7023268, Applicant (Alcatel-Lucent), Feb. 26, 2013, 3 pages.

Japanese Office Action, Patent Application No. 2011-553072, Applicant (Alcatel-Lucent), Mar. 12, 2013, 6 pages.

Japanese Office Action, Patent Application No. 2011-553080, Applicant (Alcatel-Lucent), Mar. 7, 2013, 3 pages.

* cited by examiner

FORMAT 1 (OP=1): CALL

| OP | DISP30 |
|---|---|
| 31 29 | 0 |

FORMAT 2 (OP=0): SETHI & BRANCHES (BICC, FBFCC, CBCCC)

| OP | RD | OP2 | IMM22 |
|---|---|---|---|
| OP | A | COND | OP2 | DISP22 |
| 31 | 29 28 | 24 | 21 | 0 |

FORMAT 3 (OP=2 OR 3): REMAINING INSTRUCTIONS

| OP | RD | OP3 | RS1 | I=0 | ASI | RS2 |
|---|---|---|---|---|---|---|
| OP | RD | OP3 | RS1 | I=1 | SIMM13 | |
| OP | RD | OP3 | RS1 | OPF | RS2 |
| 31 | 29 | 24 | 18 | 13 12 | 4 | 0 |

FIG. 4A

| 31 | 30 29 28 27 26 25 | 24 23 22 21 20 19 | 18 17 | 16 | 15 | 14 |
|---|---|---|---|---|---|---|
| 0 | SVF CODING | 0 0 0 0 TAP STATE | O1 | O2 | O3 | O4 |

FIG. 4B

| IEEE 1149.1 TAP STATE NAME | SVF TAP STATE NAME | 4-BIT CODING |
|---|---|---|
| Test-Logic-Reset | RESET | 0000 |
| Run-Test/Idle | IDLE | 0001 |
| Select-DR-Scan | DRSELECT | 0010 |
| Capture-DR | DRCAPTURE | 0011 |
| Shift-DR | DRSHIFT | 0100 |
| Exit1-DR | DREXIT1 | 0101 |
| Pause-DR | DRPAUSE | 0110 |
| Exit2-DR | DREXIT2 | 0111 |
| Update-DR | DRUPDATE | 1000 |
| Select-IR-Scan | IRSELECT | 1001 |
| Capture-IR | IRCAPTURE | 1010 |
| Shift-IR | IRSHIFT | 1011 |
| Exit1-IR | IREXIT1 | 1100 |
| Pause-IR | IRPAUSE | 1101 |
| Exit2-IR | IREXIT2 | 1110 |
| Update-IR | IRUPDATE | 1111 |

FIG. 4C

| | |
|---|---|
| TDI | |
| TDO | |
| MASK | |
| SMASK | |
| GENERIC1 | |
| GENERIC2 | |

FIG. 4D

| INSTRUCTION | SVF CODING |
|---|---|
| ENDDR | 000000 |
| ENDIR | 000001 |
| STATE | 000010 |
| FREQUENCY | 000011 |
| PIO | 000100 |
| HDR | 000110 |
| HIR | 000111 |
| SDR | 001000 |
| SIR | 001001 |
| TDR | 001010 |
| TIR | 001011 |

FIG. 4E

| C command | SVF Instructions | TISA Assembler | TISA coding |
|---|---|---|---|
| Apply_JTAG(value, B1.T) | SIR 8 TDI(00) | SET 8, %cGENERIC1<br>SET 00, %cTDI<br>SIR TDI | ...<br>...<br>12010000 |
|  | SIR 24 TDI(value) | SET 24, %cGENERIC1<br>SET value, %cTDI<br>SDR TDI | ...<br>...<br>10010000 |
| Read_JTAG (value, B2.R) | SIR 8 TDI(01) | SET 8, %cGENERIC1<br>SET 01, %cTDI<br>SIR TDI | ...<br>...<br>12010000 |
|  | SIR 16 ACTUAL(value) | SET 16, %cGENERIC1<br>SET "value", %cGENERIC2<br>SDR ACTUAL | ...<br>...<br>10008000 |

| |
|---|
| StatusRegister |
| ControlRegister |
| BlockRegister |
| ScanLengthRegister |
| ScanStateRegister |
| UserDataRegister1 |
| UserDataRegister2 |
| ... |
| UserDataRegister11 |

R01 Test Processor User
Accessible Data Registers

FIG. 16A

| |
|---|
| BlockOffsetField |
| ScanLengthField |
| StateTraversalField |
| SourceLocationField |
| DestinationLocationField |
| ExpectedValueField |
| ResponseLocationField |
| MaskField |
| ResultLocationField |

R03 Scatter/Gather
Segment Descriptions

FIG. 16C

| |
|---|
| BlockPointerRegister |
| BlockCountRegister |
| InstructionRegister |

R02 Internal
Scratch Registers

FIG. 16B

| |
|---|
| BlockOffsetField |
| BlockCountField |
| ScatterGatherOpcodeField1 |
| ScatterGatherBlockField1 |
| ... |
| ScatterGatherOpcodeFieldN |
| ScatterGatherBlockFieldN |

R04 MultiBlock Scatter/Gather
Segment Descriptions

FIG. 16D

METHOD AND APPARATUS FOR SYSTEM TESTING USING MULTIPLE INSTRUCTION TYPES

CROSS-REFERENCE TO RELATED APPLICATIONS

This application claims the benefit of U.S. Provisional Patent Application Ser. No. 61/157,412, filed on Mar. 4, 2009, entitled TEST INSTRUCTION SET ARCHITECTURE, which application is incorporated herein by reference in its entirety.

This application is related to U.S. patent application Ser. No. 12/495,295, entitled "METHOD AND APPARATUS FOR SYSTEM TESTING USING MULTIPLE PROCESSORS," and is related to U.S. patent application Ser. No. 12/495,336, entitled "METHOD AND APPARATUS FOR SYSTEM TESTING USING SCAN CHAIN DECOMPOSITION," each of which is filed concurrently with this application and is incorporated herein by reference in its entirety.

FIELD OF THE INVENTION

The invention relates to the field of system testing and, more specifically but not exclusively, to generation and control of instructions for system testing.

BACKGROUND

Electronic circuits are typically constructed in the form of a printed circuit board (PCB) that includes a plurality of electronic components soldered to a circuit board substrate having conductive traces interconnecting various device terminals to form an electrical circuit. As PCBs and the implemented electrical circuits thereof are often complex, board testing at manufacture has become increasingly automated. In this respect, board testing apparatuses have evolved from simple I/O functional testers that connect to I/O connectors of a populated PCB for high level automated functional testing, to test fixtures that include probe pins for making electrical contact with all or some of the circuit nodes of a tested board for performance of high level and lower level testing, to integrated testing devices that provide for automated testing of a PCB without the need to externally probe individual circuit nodes of the tested board.

The testing of electronic circuits in boards and devices is typically controlled by Testing Automation Tools, which support the steps needed to proceed from a definition of the test algorithm to the actual testing operation. In order to facilitate testing automation, testing resources often are embedded inside the boards and devices, and can be accessed using a standardised interface, usually called a Test Access Port (TAP). This has the effect of limiting the pin count and rationalising resource access and management. In general, most of the existing standards offer one or more languages that can be used to describe the resources inside the system under test (SUT), and which can be used as inputs to Testing Automation Tools. These Testing Automation Tools can apply their own algorithms in order to generate testing sequences exploiting the TAP. These testing sequences can then be used by a Test Control Unit (TCU) to command the TAP and execute the testing operations. The features and performance of the testing operations depend on each of these elements, namely, the access standard, the data format, and the TCU implementation.

The Joint Test Action Group (JTAG) has developed a circuit board testing standard, denoted as IEEE 1149.1. IEEE 1149.1 specifies a Test Access Port (TAP) for testing circuit boards. IEEE 1149.1 supports Boundary Scan (BS) testing of hardware via test devices included on the tested circuit boards. Boundary Scan testing involves controlling and monitoring boundary pins of a JTAG-compatible device under the control of software to provide test coverage beyond that which might otherwise be available. Further, Instruction JTAG (IJTAG) is being standardized (denoted as P1687) to overcome existing JTAG limitations associated with moving from board-level JTAG to chip-level JTAG.

JTAG and IJTAG may be used by Automated Test Generation (ATG) tools to test chips and electronic devices. JTAG presents a simple 5-wire TAP that allows serially access, with minimal overhead, to resources implemented inside a chip. The access infrastructure can then be described into a specific language such as the Boundary Scan Description Language (BSDL), which can be used by many commercial TGTs to generate testing vectors. These testing vectors are typically saved in a format called Serial Vector Format (SVF), which enables a high-level description of the basic operations of the 1149.1 TAP. A more complex alternative to SVF is STAPL, which extends the vector operations of SVF to allow for basic flow control (if-then-else) and arithmetic operations on the test vectors. A JTAG-compliant TAP receives commands from a SVF or STAPL player, and generates simple Go/NoGo results which can later be interpreted offline.

Disadvantageously, these existing approaches have many limitations. A first limitation is in the data format, because the test player does not have any knowledge of the system under test and, therefore, can perform only very basic operations. A second limitation is that interactive testing (local or remote) cannot be supported; rather, any testing results must be examined offline. Further, these existing approaches are implementation-dependent and are typically proprietary.

SUMMARY

Various deficiencies in the prior art are addressed through methods and apparatuses for generating test instructions for use in performing system testing.

In one embodiment, an apparatus for use in testing at least a portion of a system under test via a Test Access Port (TAP) includes a memory for storing a set of instructions of a test instruction set architecture and a processor executing the set of instructions of the test instruction set architecture for testing at least a portion of the system under test via the TAP. The set of instructions of the test instruction set architecture includes a first set of instructions including a plurality of instructions of an Instruction Set Architecture (ISA) supported by the processor and a second set of instructions including a plurality of test instructions associated with the TAP. The instructions of the first set of instructions and the instructions of the second set of instructions are integrated to form the set of instructions of the test instruction set architecture.

In one embodiment, a computer processor for testing a system under test via a Test Access Port (TAP) includes circuitry configured to process instructions according to a test instruction set architecture having semantics that enable interaction with the system under test via the TAP, The test instruction set architecture includes a plurality of instructions of a first type and a plurality of instructions of a second type. The first type instructions include instructions of an instruction set architecture (ISA) supported by the computer processor. The second type instructions include test instructions for testing the system under test via the TAP.

In one embodiment, a method is provided for adapting an Instruction Set Architecture (ISA) flow of a processor to support testing of at least a portion of a system under test by the processor via a Test Access Port (TAP). The method includes generating a first set of instructions including ISA instructions supported by the processor, generating a second set of instructions including test instructions associated with the TAP, integrating the first set of instructions and the second set of instructions to form thereby a set of TISA instructions, and performing at least one of storing, executing, or propagating the TISA instructions.

BRIEF DESCRIPTION OF THE DRAWINGS

The teachings presented herein can be readily understood by considering the following detailed description in conjunction with the accompanying drawings, in which:

FIGS. 4A-4E depict an implementation of the TISA using a SPARC V8 ISA, illustrating the details of instruction coding for the implementation of the TISA using a SPARC V8 ISA;

FIG. 16 depicts an exemplary register set that can be used by a TISA processor;

To facilitate understanding, identical reference numerals have been used, where possible, to designate identical elements that are common to the figures.

DETAILED DESCRIPTION

Various system testing capabilities are provided for use in performing testing of a system under test (SUT).

In one embodiment, a test instruction set architecture (TISA) is provided. The TISA is provided for use in performing system testing. The TISA combines computer science capabilities with system testing capabilities to provide improved system testing capabilities, including interactive testing capabilities, remote testing capabilities, and various other capabilities described herein. The TISA is formed by adapting a software-based instruction set architecture (ISA) using system testing capabilities. The software-based ISA may utilize any suitable software programming language (e.g., C++, Java, and the like, as well as various combinations thereof) and may be implemented using any suitable processor. The system testing capabilities may utilize any suitable TAP, such as IEEE 1149.1 (also known as JTAG) TAPs or any other suitable TAPs. In general, the TISA is formed by combining the atomic operations of a software process with atomic testing operations of a test procedure. In the TISA, the algorithmic portions of the test procedure are handled by the software flow, such that the algorithmic portions of the test procedure are translated into the atomic testing operations. The TISA is formed by combining the atomic operations of the software process with the atomic testing operations of the test procedure, such that the atomic testing operations are treated in the same manner as the atomic operations of the software process that is handling the algorithmic portions of the test procedure. This enables finer-grain control of embedded test execution, remote test execution, and various other improved system testing capabilities as depicted and described herein.

Figure 1:
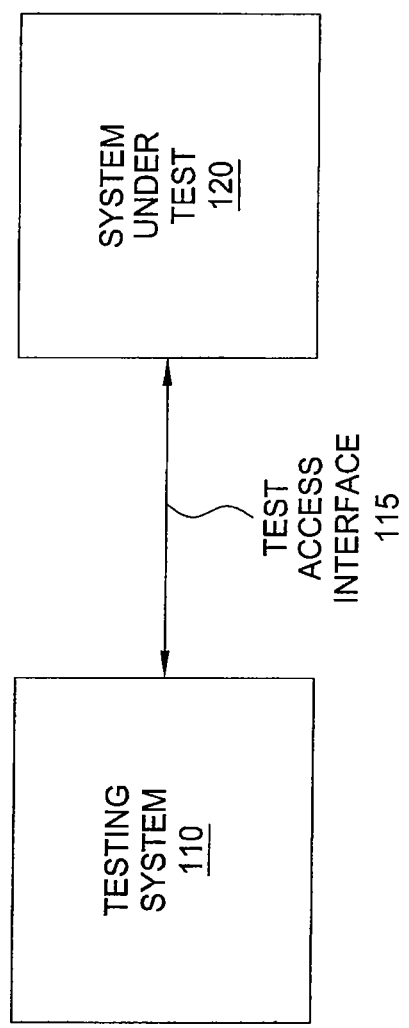
FIG. 1 depicts a high-level block diagram of a system testing environment including a testing system and a system under test.

FIG. 1 depicts a high-level block diagram of a system testing environment including a testing system and a system under test.

As depicted in FIG. 1, system testing environment 100 includes a testing system (TS) 110 and a system under test (SUT) 120.

The TS 110 may be any system suitable for testing SUT 120. The TS 110 is configured for testing SUT 120. The TS 110 may perform any testing of SUT 120, e.g., testing one or more individual components of SUT 120, one or more combinations of components of SUT 120, one or more interconnections between components of SUT 120, one or more system level functions of SUT 120, and the like, as well as various combinations thereof. The TS 110 may perform any of the functions typically associated with testing a system under test, such as executing test procedures, providing input data to the system under test, receiving output data from the system under test, processing output data received from the system under test for determining system testing results, and like functions, as well as various combinations thereof. The design and use of TS 110 for testing a system under test is described in additional detail hereinbelow.

The SUT 120 may be any system which may be tested using TS 110. The SUT 120 may include any component(s), at least a portion of which may be tested, individually and/or in combination, by TS 110. The SUT 120 may include one or more scan chains, having one or more sets of associated input and output access pins, providing access to the component(s) to be tested by TS 110. The manner in which a scan chain(s) may be utilized in SUT 120 for testing SUT 120 will be appreciated by one skilled in the art. For example, SUT 120 may include one or more boards, testing of which may be performed using one or more scan chains having associated input and output access pins which may be used for applying input testing signals to SUT 120 and collecting output testing signals from SUT 120.

As depicted in FIG. 1, TS 110 accesses SUT 120 via a test access interface (TAI) 115. The test access interface may be implemented using any suitable test access interface, which may depend on one or more of the TS 110, the SUT 120, the type of testing to be performed, and the like, as well as various combinations thereof.

For example, TAI 115 may include a Joint Test Action Group (JTAG) Test Access Port (TAP) as standardized in IEEE 1149.1 standard, which is incorporated by reference herein in its entirety. The IEEE 1149.1 standard defines a TAP that supports the following set of signals: Test Data In (TDI), Test Data Out (TDO), Test Mode Select (TMS), Test Clock (TCK), and, optionally, Test Reset Signal (TRST). The TDI and TDO pins of SUT 120 are interconnected in a boundary scan chain by which TS 110 may access SUT 120 for testing at least a portion of SUT 120.

The TAI 115 may include any other suitable test access interface.

It will be appreciated by one skilled in the art that TS 110, TAI 115, and SUT 120 may be implemented in any manner suitable for providing features of the embodiments covered herein.

As described herein, the TISA is able to leverage computer science capabilities in combination with system testing capabilities to provide a significant improvement in system testing. A general description of system testing capabilities and computer science capabilities follows, followed by a description of the manner in which computer science capabilities and system testing capabilities may be utilized together to provide the TISA.

The TISA improves upon system testing capabilities by leveraging computer science capabilities. The system testing capabilities may include the capabilities generally supported in all stages of the "automated test" flow (which generally includes all of the steps and resources that may be needed to get from a definition of the test algorithm(s) to actual testing operations).

In order to help test automation, test resources often are embedded inside the boards and devices, and can be accessed using a standardised interface, usually called the Test Access Port (TAP). This has the effect of limiting the pin count and rationalising resource access and management. A number of languages are available for describing resources inside a system under test, and, thus, which may be used as inputs to Test Generation Tools (TGTs). TGTs can apply algorithms to generate testing sequences which may be used by a Test Control Unit (TCU) to command the TAP and execute the associated testing operations. The features and performances of the testing operations depend on these three elements: the access standard, the data format, and the TCU implementation.

The TISA is able to leverage computer science capabilities to provide improved system testing capabilities. This may include use of computer science capabilities that are available in all stages of the "software development flow" (which generally includes any or all of the steps and resources that may be needed to get from a software algorithm coded in a software language(s) of choice to the final debugging and execution on a target processor, such as compilation, an Instruction Set Architecture (ISA), interactive debugging, and the like, as well as various combinations thereof).

The use of compilation in computer science reduces an algorithm defined in a programmer-friendly high level abstraction to a series of machine-executable instructions. This process can vary greatly, depending on the input programming language and project complexity; however, most, if not all, of the approaches share the same basic assumption: any algorithm can be decomposed into basic instructions, regardless of its complexity. This applies to classic languages, as well as to more modern high-level and object oriented languages such as, for example, C++, Java, Python, and the like.

The Instruction Set Architecture (ISA) is the core of any processor, and the reason for which compilation is so effective. In general, each processor offers a set of instructions which define the manner in which the processor can be operated. The instructions form at least part of the ISA of the processor. It will be appreciated that the ISA may be considered to include various constructs associated with the instructions, such as registers, addressing modes, opcodes, memory structures, and the like, as well as various combinations thereof. The ISA enables the processor to execute simple instructions, such as reading/writing values from/to memory, perform logical or arithmetical operations on registers, handle interruption, and the like. This basic behaviour has remained essentially unchanged over time, and modern processors achieve exceptional performances because they can efficiently exploit great numbers of resources, and, thus, are able to complete a much larger number of such basic instructions in approximately the same amount of time. Furthermore, even higher performances may be reached from the use of co-processors (e.g., floating-point co-processors, graphical co-processors, and the like), which can help the main processor by hard-coding complex operations.

The use of debugging in computer science allows monitoring and verification of the software development and execution process. In general, software development is a long and difficult process, which is strictly monitored and verified to assure that the final product is free of defaults, or "bugs" are they are usually called. In order to help test software programs, the software development flow provides many powerful debug features. For example, common software development flow debug features include step-by-step execution; observability/controllability of all registers and memory locations, use of breakpoints and watchpoints, and the like. These debug features, as well as various other debug features, are more often enabled by algorithms and structures embedded into the final code by the software compiler, but may also be assisted by hardware resources available inside of the processor. From this information the debugger can reconstruct the original code and correlate all the ISA-level operations to the programming abstraction layer.

Figure 2:
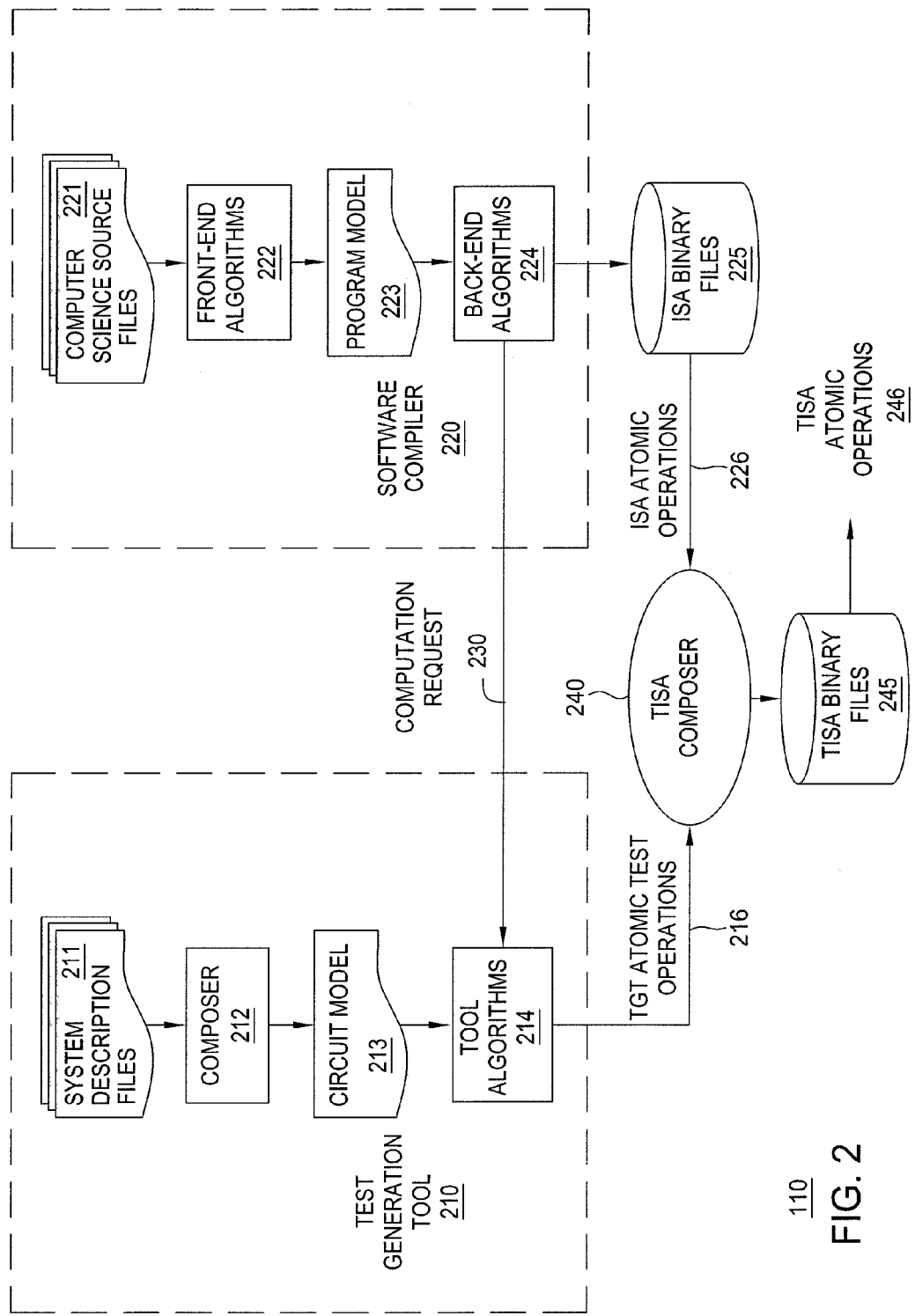
FIG. 2 depicts a high-level block diagram of one embodiment of the testing system of FIG. 1, including a test generation tool and a software compiler cooperating to generate test instructions for a system under test.
Figure 3:
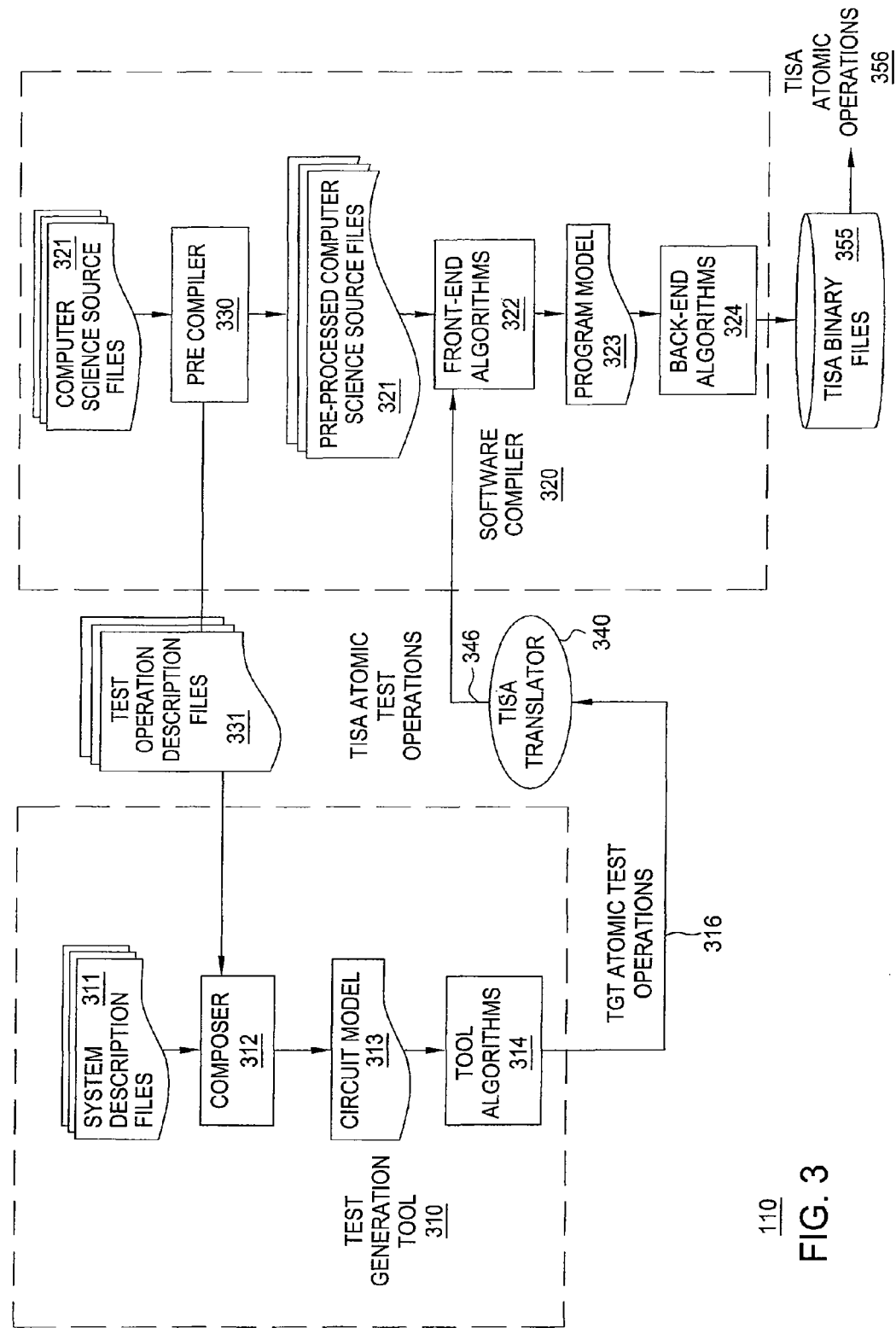
FIG. 3 depicts a high-level block diagram of one embodiment of the testing system of FIG. 1, including a test generation tool and a software compiler cooperating to generate test instructions for a system under test.

The use of automated test execution capabilities and computer science software capabilities together to enable improved system testing capabilities may be better understood by way of reference to FIG. 2 and FIG. 3.

FIG. 2 depicts a high-level block diagram of one embodiment of the testing system of FIG. 1, including a test generation tool and a software compiler cooperating to generate test instructions for a system under test.

As depicted in FIG. 2, the TS 110 includes a test generation tool (TGT) 210 and a software compiler (SC) 220.

The TGT 210 includes a TGT composer 212 and TGT algorithms 214.

The TGT composer 212 accepts system description files 211 as input. The system description files 211 include any suitable description files which may be used by a TGT to produce testing instructions/vectors for testing a system under test. For example, system description files 211 may include circuit description files, board/fixture netlist files, other description files, and the like, as well as various combinations thereof. The system description files 211 may be available on TGT 210 and/or may be obtained from one or more remote components and/or systems.

The system description files 211 may include one or more circuit description files. The circuit description files may be specified using any suitable description language(s), such as the Boundary Scan Description Language (BSDL, which was developed as part of the IEEE 1149.1 standard for board-level JTAG), the Hierarchical Scan Description Language (HSDL, which was developed as an extension of BSDL), New Scan Description Language (NSDL), and the like, as well as various combinations thereof.

The system description files 211 may include one or more board/fixture netlist files. The board/fixture netlist files may include files related to the physical description of the device(s), describing the netlist, connections, and like information. The board/fixture netlist files may be specified in any suitable format, such as PCB, Gerber, and/or any other format suitable for board/fixture netlist files.

The system description files 211 may include one or more other description files. The other description files may include any other suitable description files which may be used as input for producing a circuit model. For example, other description files may include any suitable application-specific and/or tool-specific description language files, such as Asset's Macro Language, Goepel's CASLAN Language, and/or any other suitable description language files.

The TGT composer 212 processes the system description files 211 to produce a circuit model 213. The processing of system description files 211 by TGT composer 212 to produce circuit model 213 may be performed in any suitable manner. The circuit model 213 specifies a model of the system under test or portion of the system under test for which TGT 210 is being run. The TGT composer 212 provides circuit model 213 to TGT algorithms 214.

The TGT algorithms 214 accept circuit model 213. The TGT algorithms 214 process the circuit model 213 to produce TGT atomic test operations 216. The processing of circuit model 213 by TGT algorithms 214 to produce the TGT atomic test operations 216 may be performed in any suitable manner.

The SC 220 includes SC front-end algorithms 222 and SC back-end algorithms 224.

The SC front-end algorithms 222 accept computer science source files 221 as input. The computer science source files 221 include any suitable computer science source files which may be compiled by a compiler. For example, computer science source files 221 may include computer science source files for any suitable computer programming language(s), such as C++, Java, Python, and the like, as well as various combinations thereof. For example, computer science source files 221 may include one or more of one or more C files, one or more C++ files, and/or any other suitable computer science source files.

The SC front-end algorithms 222 process the computer science source files 221 to produce a program model 223. The program model 223 specifies an intermediate representation of the computer science source files 221. The SC front-end algorithms 222 provide the program model 223 to the SC back-end algorithms 224.

The SC back-end algorithms 224 accept program model 223 as input. The SC back-end algorithms 224 process the program model 223 to produce one or more ISA Binary Files 225 including ISA atomic operations 226. The processing of program model 223 by the SC back-end algorithms 224 to form the ISA Binary Files 225 including the ISA atomic operations 226 may be performed in any suitable manner. The ISA atomic operations 226 are assembly-level instructions supported by the processor for which the TISA is implemented.

As depicted in FIG. 2, in addition to the respective processing flows of TGT 210 and SC 220, additional interaction between TGT 210 and SC 220 may be utilized for controlling generation of the TISA atomic operations 235. In one embodiment, SC back-end algorithms 224 may initiate one or more vector computation requests 230 to TGT algorithms 214. The SC back-end algorithms 224 may initiate a vector computation request 230 when the SC back-end algorithms need to access the TAP. The TGT algorithms 214, upon receiving a vector computation request 230 from SC back-end algorithms 224, generate one or more TGT atomic test operations 216 for the TAP based on the received vector computation request 230. The one or more TGT atomic test operations 216 may then be applied to the TAP in a manner controlled by SC back-end algorithms 224, because the TGT atomic test operations 216 are combined with the ISA atomic operations 226 to enable algorithmic control over TGT atomic test operations 216 using ISA atomic operations 226. In this manner, the SC 220 provides algorithmic control of access to the TAP.

As depicted in FIG. 2, in addition to TGT 210 and SC 220, TS 110 further includes a TISA composer 240. The TISA composer 240 accepts the TGT atomic test operations 216 and the ISA atomic operations 226. The TISA composer 240 converts the TGT atomic test operations 216 into TISA instructions and inserts the TISA instructions into the ISA Binary File(s) 225 (i.e., combining the TISA instructions with the ISA atomic operations 226 to form thereby TISA Binary files 245 including TISA atomic operations 246. The TISA composer 240 may be part of TGT 210, part of SC 220, split across TGT 210 and SC 220, implemented separate from TGT 210 and SC 220, and the like.

It will be appreciated that the various inputs and outputs depicted and described with respect to FIG. 2 may be stored, displayed, executed, propagated, and/or handled in any other suitable manner, as well as various combinations thereof.

FIG. 3 depicts a high-level block diagram of one embodiment of the testing system of FIG. 1, including a test generation tool and a software compiler cooperating to generate test instructions for a system under test.

As depicted in FIG. 3, TS 110 of FIG. 3 operates in a manner similar to TS 110 of FIG. 2, in that TISA Binary files including TISA atomic operations are generated using interaction between the test generation tool and the software compiler; however, interaction between the test generation tool and the software compiler in TS 110 of FIG. 3 is different than interaction between the test generation tool and the software compiler in TS 110 of FIG. 2.

As depicted in FIG. 3, the TS 110 includes a test generation tool (TGT) 310 and a software compiler (SC) 320.

The TGT 310 includes a TGT composer 312 and TGT algorithms 314.

The TGT composer 312 accepts system description files 311 as input. The system description files 311 include any suitable description files which may be used by a TGT to produce testing instructions/vectors for testing a system under test. For example, system description files 311 may include circuit description files, board/fixture netlist files, other description files, and the like, as well as various combinations thereof. The system description files 311 of FIG. 3 may include system description files similar to system description files 211 depicted and described with respect to FIG. 2 (e.g., one or more circuit description files, one or more board/fixture netlist files, one or more other description files, and the like, as well as various combinations thereof). The system description files 311 may be available on TGT 310 and/or obtained from one or more remote components and/or systems.

The TGT composer 312 accepts one or more test operation description files $331_1$-$331_N$ (collectively, test operation description files 331) as input. The test operation description files 331 are generated by SC 320. The generation of test operation description files 331 by SC 320 is described in detail hereinbelow.

The TGT composer 312 processes the system description files 311 and the test operation description files 331 to produce a circuit model 313. The processing of system description files 311 by TGT composer 312 to produce circuit model 313 may be performed in any suitable manner. The circuit model 313 specifies a model of the system under test or portion of the system under test for which TGT 310 is being run. The processing of system description files 311 in conjunction with test operation description files 331 enables the TGT composer 312 to produce circuit model 313 in a manner for enabling TGT 310 to produce appropriate TAP atomic operations. The TGT composer 312 provides circuit model 313 to TGT algorithms 314.

The TGT algorithms 314 accept circuit model 313. The TGT algorithms 314 process the circuit model 313 to produce TGT atomic test operations 316. The processing of circuit model 313 by TGT algorithms 314 to produce the TGT atomic test operations 316 may be performed in any suitable manner.

As depicted in FIG. 3, in addition to TGT 310 and SC 320, TS 110 includes a TISA translator 340. The TISA translator 340 receives the TGT atomic test operations 316. The TISA translator 340 translates TGT atomic test operations 316 to form TISA atomic test operations 346. The TISA translator 340 provides TISA atomic test operations 346 to SC 320 for inclusion in the software compilation process. The use of TISA atomic test operations 346 by SC 320 is described in detail hereinbelow. The TISA translator 340 may be part of TGT 310, part of SC 320, split across TGT 310 and SC 320, implemented separate from TGT 310 and SC 320, and the like.

The SC 320 includes a SC pre-compiler 330, SC front-end algorithms 322, and SC back-end algorithms 324.

The SC pre-compiler 330 accepts computer science source files 321.

The computer science source files 321 include any suitable computer programming source files which may be compiled by a compiler. For example, computer science source files 321 may include computer programming source files for any suitable computer programming language(s), such as C++, Java, Python, and the like, as well as various combinations thereof. For example, computer science source files 321 may include one or more of one or more C files, one or more C++ files, and/or any other suitable computer science source files.

The SC pre-compiler 330 processes the computer science source files 321.

The SC pre-compiler 330 processes the computer science source files 321, producing therefrom pre-processed computer science source files $321_P$. The computer science source files 321 may be pre-processed by SC pre-compiler 330 to form pre-processed computer science source files $321_P$ in any suitable manner. The SC pre-compiler 330 provides the pre-processed computer science source files $321_P$ to front-end algorithms 322.

The SC pre-compiler 330 detects test operations during processing of the computer science source files 321, and generates the test operation description files 331. The test operation description files 331 may be specified using any suitable test description language (e.g., using one or more standard test description languages, using a test description language specific to the TGT 310, and the like, as well as various combinations thereof). The SC pre-compiler 330 provides the test operation description files 331 to TGT 310 (illustratively, to the TGT composer 312 of TGT 310, which processes the test operation description files 331 in conjunction with the system description files 311 to produce circuit model 313).

The SC front-end algorithms 322 accept pre-processed computer science source files $321_P$. The SC front-end algorithms 322 also accept the TISA atomic test operations 346, which are produced by TISA translator 340 using TGT atomic test operations 316 produced by TGT 310 from the test operation description files 331. The SC front-end algorithms 222 compile the pre-processed computer science source files $321_P$ and TISA atomic test operations 346 to produce a program model 323. The program model 323 specifies an intermediate representation of the pre-processed computer science source files $321_P$, which includes TISA atomic test operations 346 such that TISA atomic test operations 346 may be integrated within the ISA atomic operations to form TISA atomic operations. The SC front-end algorithms 322 provide the program model 323 to the SC back-end algorithms 324.

The SC back-end algorithms 324 accept program model 323. The SC back-end algorithms 324 process program model 223 to produce one or more TISA Binary Files 355 including TISA atomic operations 356. The processing of program model 323 by the SC back-end algorithms 324 to form the TISA Binary Files 355 including the TISA atomic operations 356 may be performed in any suitable manner.

The TISA atomic operations 356 include ISA atomic operations (i.e., assembly-level instructions supported by the processor for which the TISA is implemented) and TISA atomic test operations 346.

The TISA atomic operations 356 provide algorithmic control (using ISA atomic operations) over TGT atomic test operations 316 (i.e., in the form of the TISA atomic test operations 346), thereby enabling improved system testing of the system under test to which the TISA atomic operations 356 are to be applied. Thus, the TGT atomic test operations 316 (i.e., in the form of the TISA atomic test operations 346) may be applied to the TAP in a manner controlled by SC back-end algorithms 324, because the TGT atomic test operations 316 are combined with the ISA atomic operations to enable algorithmic control over TGT atomic test operations 316 using the ISA atomic operations. In this manner, the SC 220 provides algorithmic control of access to the TAP.

It will be appreciated that the various inputs and outputs depicted and described with respect to FIG. 3 may be stored, displayed, executed, propagated, and/or handled in any other suitable manner, as well as various combinations thereof.

With respect to FIG. 2 and FIG. 3, although primarily depicted and described with respect to specific numbers of input files, intermediate files, models, output files, and the like, it will be appreciated that the embodiments of FIG. 2 and FIG. 3, as well as various associated teachings provided herein, may be implemented using any suitable numbers of input files, intermediate files, models, output files, and the like.

FIG. 2 and FIG. 3 illustrate the manner in which computer science capabilities may be leveraged to improve system testing capabilities (e.g., providing finer-grain control of system testing, enabling interactive system testing, enabling interactive debugging during system testing, and providing various other advantages depicted and described herein). The system testing schemes of FIG. 2 and FIG. 3 provide improvements over existing approaches, such as STAPL, where the goal is to add programming features to vector formats and, therefore, debugging, remote access, and interactivity features are added from scratch. By contrast, the TISA leverages the wealth of information from computer programming and embedded applications to control test access for system testing.

Referring to FIGS. 2 and 3, it will be appreciated that the capabilities and features of the TISA are defined by its abstraction level, i.e., the finer the definition of the TISA atomic operations, the better performance the TISA will provide.

In one embodiment, in which TISA is implemented in a JTAG architecture, three abstraction levels may be supported for scan operations.

The first abstraction level is the Vector Level. The Vector Level is the coarsest grain of the three abstraction levels, where the atomic operations are inputs and outputs of scan vectors. The Vector Level is best represented in a vector format, such as Serial Vector format (SVF) or any other suitable vector format, and gives the highest-level control.

The second abstraction level is the TAP Level. In the TAP Level, the atomic operations are enhanced to allow full control over the TAP state machine. This enables more refined control over scan operations, support of non-standard sequences (e.g., like the ones required, for instance, in the Addressable Shadow Protocol or other similar protocols).

The third abstraction level is the Scan Segments Level. The Scan Segments Level is the finest grain of the three abstraction levels. The Vector Level and TAP Level abstraction levels use the scan vector as the atomic data format, which is sufficient for traditional continuity tests where the entire scan chain is involved, but is cumbersome for instrument-based testing where there is a need for fine-grain control over the tens or hundreds of instruments that compose the scan chain. The Scan Segments Level allows the definition of "scan segments" inside the overall scan path, which can be handled separately, thereby providing a flexible and powerful set of primitives that can be used to define scan operations directly in the problem space and resolve the scan operations at implementation time. This approach is advantageous in embedded applications, where the available computational resources may be quite limited. The use of Scan Segments Level is depicted and described in additional detail hereinbelow.

As depicted in FIG. 2 and FIG. 3, regardless of the abstraction level of the scan operations, the resulting TAP atomic operations (illustratively, TGT atomic test operations 216 and TGT atomic test operations 316) computed by the TGT are converted into corresponding TISA atomic test operations and inserted into the binary executable (i.e., into the ISA atomic operations generated by the SC).

Referring to FIG. 2, TGT atomic test operations 216 and ISA atomic operations 226 can be processed to form the TISA atomic operations 246 in the TISA binary executables (illustratively, TISA binary files 245). The TISA atomic operations 246 include TISA atomic test operations and ISA atomic operations.

Referring to FIG. 3, TISA atomic test operations (generated by TISA translator 340 from TGT atomic test operations 316 produced by TGT 310) can be input into the SC front end 324 as pre-compiled assembly instructions, without any need to modify the SC front end 324 of SC 310. It will be appreciated that almost all programming languages allow for such operations. In C, for example, this operation is obtained using the "asm" command. In one embodiment, minor modifications to SC back-end algorithms 324 may be required (e.g., to handle binary conversion of the TISA assembler instructions). An example of such a process is depicted and described herein with respect to FIG. 11.

Although primarily depicted and described with respect to levels of granularity of TISA atomic operations in a JTAG architecture, it will be appreciated by one skilled in the art that the same levels of granularity of TISA atomic operations may be utilized in other architectures, that different levels of granularity of TISA atomic operations may be utilized in a JTAG architecture and/or other architectures, and the like, as well as various combinations thereof.

As described hereinabove, the TISA may be implemented using any suitable instruction set architecture (ISA). For example, the TISA may be implemented using the SPARC V8 ISA, an INTEL ISA, and the like.

For purposes of clarity in describing implementation of the TISA, an exemplary implementation of the TISA using a SPARC V8 ISA is depicted and described herein with respect to FIGS. 4A-4E. In this exemplary implementation, the TISA is implemented as a Vector Level TISA, which allows direct coding of the instructions that compose the SVF format; however, as described hereinabove, it will be appreciated that implementation of the TISA using the SPARC V8 ISA also may be performed where the TISA is implemented as a TAP Level TISA or a Scan Segment Level TISA.

The SPARC V8 ISA is implemented in many products, such as the open-source soft processor family Leon 2 and Leon 3.

A review of "The SPARC Architecture Manual Version 8," published by SPARC International, Inc, 1992 (hereinafter "SPARC Architecture Manual"), reveals that there are many code words not exploited by the SPARC V8 ISA. This is evident at least from a review of the "opcodes and condition codes" of Appendix F.

FIG. 4A depicts the unexploited code words of the SPARC V8 ISA. The unexploited code words depicted in FIG. 4A may be used to code the "test" instructions for the TISA. More specifically, when both "op" and "op2" are set to 0, the instruction is marked as unimplemented in "The SPARC Architecture Manual Version 8," such that the instruction may be used for the TISA.

FIG. 4B depicts a coding format able to represent all thirteen of the SVF instructions. As depicted in FIG. 4B, bits 30-25 include the instruction coding itself, bits 21-18 may be used to code a TAP state if one is to be used with the instruction, and bits 17-14 can be used by each instruction to specify optional information where needed.

FIG. 4C depicts an exemplary bit coding of the TAP states for an IEEE 1149.1 TAP. The bit coding of the TAP states is represented using a first column that identifies the IEEE 1149.1 TAP State Name, a second column that identifies the SVF TAP State Name associated with the IEEE 1149.1 TAP State Name, and a third column that identifies the bit coding for bits 21-18 of FIG. 4B. It will be appreciated that the bit codings may be assigned to the TAP states in various other ways.

The SVF instructions allow for multiple parameters, which need to be coded inside the final code. In order to represent the parameters, and in the interest of the usual architectural best practice of keeping instruction and data separated, register-based parameter passing is defined for this exemplary implementation of a Vector Level TISA. Thus, the Vector Level TISA presents six dedicated 32-bit registers: GENERIC1, GENERIC2, TDI, TDO, MASK and SMASK. The six dedicated 32-bit registers are depicted in FIG. 4D. The usage of the six dedicated 32-bit registers is described in detail hereinbelow, but, as a general rule, these registers are used either to store a parameter or to point to the memory location in which a parameter is stored. Thus, at compilation time, normal ISA instructions can be used to load these registers before the TISA instruction is invoked. More specifically, in this SPARC V8 ISA implementation of the TISA, coprocessor registers may be used directly as parameters for the usual load/store instructions.

The SVF instructions which may be utilized in this SPARC V8 ISA implementation of the TISA include ENDDR, ENDIR, STATE, FREQUENCY, PIO, PIOMAP, HDR, HIR, TDR, TIR, SDR, SIR, and RUNTEST. These SVF instructions may be better understood by way of reference to the "Serial Vector Format Specification," by ASSET InterTech, Inc., 1997 (hereinafter referred to as the SVF Manual), which is herein incorporated by reference in its entirety. The use of these SVF instructions in this SPARC V8 ISA implementation of the TISA is described in more detail hereinbelow.

ENDDR, ENDIR, STATE

The ENDDR and ENDIR instructions indicate the TAP state at which the TAP interface ends its operation. The STATE instruction forces the TAP interface to a specified state. In this exemplary implementation of the TISA, the SVF codings for the ENDDR, ENDIR, and STATE instructions are "000000", "000001", and "000010", respectively, as depicted in FIG. 4E. The SVF coding of these SVF instructions may be performed using the "TAP STATE" file (i.e., the exemplary bit coding of the TAP states as depicted in FIG. 4C) as needed. It will be appreciated, at least from a review of the SVF Manual, that the STATE instruction can optionally take the explicit sequence of states as parameters. In this exemplary implementation of the TISA, taking the explicit sequence of states as parameters would be coded by a series of instructions, one for each state in the sequence.

FREQUENCY

The FREQUENCY instruction is used to specify the working frequency of the TAP interface. The FREQUENCY instruction is expressed as a 32-bit integer of Hz cycles. In this exemplary implementation of the TISA, the SVF coding for the FREQUENCY instruction is "000011", as depicted in FIG. 4E. The value for the FREQUENCY instruction is stored in the GENERIC1 register.

PIO, PIOMAP

The PIO instruction can be used to handle parallel vectors, in a format previously set by a call to PIOMAP. In this exemplary implementation of the RISA, PIOMAP is seen as a pre-processor directive that generates the appropriate commands to set up the TAP interface. Thus, the PIO instruction merely needs to express the parallel vector, which can be expressed by indicating (in the GENERIC1 register) the address in which the parallel vector is stored. The number of words "n" that compose the vector is specified in bits 13-0 of the instruction, and, thus, the vector has an upper size limit of $2^{13}$=8K words=32 Kbytes. If the vector size is not an exact multiple of a word, padding and re-alignment may be provided in memory, as needed. In this exemplary implementation of the TISA, the SVF coding for the PIO instruction is "000100".

HDR, HIR, TDR, TIR

The roles of the HDR, HIR, TDR, and TIR instructions are different. Here, these SVF instructions are considered together because (1) these SVF instructions are functionally similar (i.e., they all command shift operations, even if they are of a different nature), and (2) these SVF instructions accept the same parameters:

(1) length: a 32-bit number expressing the number of bits to shift;

(2) TDI (optional): the input shift vector;

(3) TDO (optional): the expected output shift vector;

(4) MASK (optional): a mask to be used when comparing actual values with TDO. A '1' indicated a care, a '0' a don't care; and (5) SMASK (optional): a mask to mark which bits are to be considered in TDI. '1' indicates a care, '0' a don't care.

In this exemplary implementation of the TISA, the SVF codings for the HDR, HIR, TDR, and TIR instructions are "000110", "000111", "001010", and "001011", respectively, as depicted in FIG. 4E.

In this exemplary implementation of the TISA, the following additional codings may be used:

(1) length is stored in the GENERIC1 register;

(2) O1 is '1' when TDI is present, '0' otherwise. If set, the TDI register contains the address at which the input vector is stored;

(3) O2 is '1' when TDO is present, '0' otherwise. If set, the TDO register contains the address at which the expected output is stored;

(4) O3 is '1' when MASK is present, '0' otherwise. If set, the MASK register contains the address at which the output mask is stored; and (5) O4 is '1' when SMASK is present, '0' otherwise. If set, the SMASK register contains the address at which the output mask is stored.

SDR, SIR

The SDR and SIR instructions have the same syntax as the HDR, HIR, TDR, and TIR instructions, but have a functional difference: SDR and SIR trigger the actual scan operation on the TAP. In interactive testing the actual output vector read from the system is fundamental for the algorithm, so the TISA offers the possibility of storing the actual output vector in memory. When the "TAP STATE" field (bits 21-18, as depicted in FIG. 4B) is different than zero, the GENERIC2 register indicates the storage location of the actual output vector. Thus, SDR and SIR can support a maximum of seven parameters. If TDO is specified and the actual output vector is different from the expected output vector, an overflow flag is set in the Processor State Register (PSR), as described in Section 4.2 of the SPARC Architecture Manual.

RUNTEST

The RUNTEST instruction forces the TAP interface to run a test at a specified state for a specified amount of time, and is used mainly to control RUNBIST operations (e.g., as defined in IEEE 1149.1). The RUNTEST instruction accepts one or more of the following parameters (all of which are optional):

(1) run_state: the state the interface must maintain during test execution;

(2) run_: the number of clock cycles the test must take;

(3) run_clk: which clock run_count refers to (TCK: TAP clock, SCK: system clock);

(4) min_time: minimum run time in seconds, expressed as a real number;

(5) max_time: maximum run time in seconds, expressed as a real number; and (6) endstate: the state the interface must reach at the end of the command.

In this exemplary implementation of the TISA, the SVF coding for the RUNTEST instruction may be "000101" or "100101".

In this exemplary implementation of the TISA, the following additional codings may be used:

(1) TAP_STATE: it contains run_state of which it is defined;

(2) O1: '1' if TAP_STATE is defined, '0' otherwise;

(3) O2: '1' if min_count is specified, '0' otherwise. If set, the GENERIC1 register contains the 32-bit unsigned representation of min_count;

(4) O3: '1' if max_time is set, '0' otherwise. If set, the GENERIC2 register contains the 32-bit unsigned representation of max_count;

(5) O4: '1' if endstate is set, '0' otherwise. If set, Bits 13-10 contain the end state.

(6) Bits 9-0: if run_count is specified, expressed as an unsigned integer (max run_count=$2^{10}$=1024). If this field is not "0", then Bit 30 indicates run_clock ('1'=TCK, '0'=SCK).

Although primarily depicted and described herein with respect to use of specific SVF instructions in this SPARC V8 ISA implementation of the TISA (i.e., namely, ENDDR, ENDIR, STATE, FREQUENCY, PIO, PIOMAP, HDR, HIR, TDR, TIR, SDR, SIR, and RUNTEST), it will be appreciated that fewer or more SVF instructions may be used.

Although primarily depicted and described herein with respect to an implementation of the TISA using the SPARC V8 ISA, it will be appreciated that various other ISAs may be utilized to implement a TISA in accordance with the TISA teachings depicted and described herein.

In interactive testing approaches, the data handoff point is quite important. As described hereinabove, a test program is composed of two main portions: the algorithmic portion (as represented by the software compiler) and the test access portion (as represented by the test generation tool). During a test operation using a testing program, there will be moments when the test program is accessing the system under test, and moments when the test program is examining the testing results and deciding the next step(s) required. The hand-off between these two operations is important for obtaining efficient interactive testing.

In existing script-based approaches, such as SVF and STAPL, a script takes care of all TAP operations at the Vector Level. At this level, the interface (or "player") is able to communicate with the TAP protocol, and send/receive vectors to/from the system under test. Furthermore, STAPL also allows some basic flow control (if-then-else) and algorithmic operations on the bit vectors. If there is need for more sophisticated processing (e.g., identifying a register inside a received vector, or computing the vector to access a specific device), the player hands control over to the algorithmic portion. In STAPL, this is done through the "export" command. Disadvantageously, however, neither SVF nor STAPL has a standardized format for this (e.g., in the case of STAPL, the handoff process is usually proprietary to a given vendor).

In existing embedded approaches, like Master Test Controller (MTC) from Ericsson and the System BIST Processor, the same partitioning between the algorithmic portion and the test access portion is used. In such embedded approaches, the algorithmic portion and the test access portion are executed by different coprocessors that must be programmed separately. Furthermore, the memory spaces of the algorithmic portion and the test access portion are physically different, such that the resulting handoff mechanisms are similar to the handoff mechanisms of STAPL. The result is that the coprocessor for the test access portion is forced to store a lot of scan operations before handoff to the algorithmic portion, which, given the increasing size of scan chains, may require a huge amount of resources.

In contrast with existing approaches to integrated testing (e.g., script-based approaches such as SVF and STAPL, and embedded approaches such as MTC and System BIST Processor), the TISA integrates the test access portion (i.e. the test operations) inside the algorithmic portion (i.e., the classical ISA), such that the test access portion and the algorithmic portion share the same physical memory space, thereby making handoff (and, thus, data passing) between the test access portion and the algorithmic portion automatic. In TISA, handoff between the test access portion and the algorithmic portion is made at the instruction level, such that the processor can freely mix scan and algorithm (i.e., freely mix test operations and algorithmic operations) as required according to the associated scheduling strategy.

In this exemplary implementation of the TISA, using the SPARC V8 ISA, all operations handling vectors use absolute addressing (as described hereinabove with respect to the SVF instructions). As a result, testing vectors may be used like normal variables inside the ISA program, thereby making the interface between the test access portion and the algorithmic portion automatic. As an example, based on the exemplary implementation of the TISA using the SPARC V8 ISA as described hereinabove, the following steps exemplify an archetypical testing sequence:

(1) An SDR instruction is used to obtain testing output data from the system under test. The resulting output data is placed in a specific memory location (e.g., the "actual" parameter in the GENERIC2 register);

(2) A classical LOAD instruction can transfer this output data to be loaded into a register;

(3) Once the output data is loaded in the register, arithmetic operations and/or logical operations may be used to process the output data (note that since the SPARC V8 ISA is a load/store architecture, all data must be loaded into a register before being handled);

(4) A classical STORE instruction is used to transfer the result of the algorithm into memory; and (5) An SDR instruction can send new testing input data to the TAP (e.g., using the "TDI" parameter in the TDI register).

Note that the classical algorithmic operations (2) through (4) are standard for any ISA algorithm implementation, and are not modified in any way by the TISA.

Thus, from this simple example, it is clear that TISA can be supported using any given algorithm or computer program, with a natural and efficient hand-off between the algorithmic portion and the test access portion.

In this exemplary implementation of the TISA, using the SPARC V8 ISA, absolute addressing is used (for purposes of clarity in describing the TISA); however, one skilled in the art and informed by the teachings herein would be able to modify this exemplary implementation of the TISA to support all legal SPARC V8 addressing modes described in the SPARC Architecture Manual.

Although primarily depicted and described herein with respect to an exemplary implementation of the TISA in which SVF is used, SVF was used in the exemplary implementation because it is a well-known format proven to provide a complete, even if basic, handling of 1149.1 TAPs. It will be appreciated, by one skilled in the art and informed by the teachings herein, that the TISA may be implemented using any other suitable control formats, many of which may allow finer grain control of the TAP state machine and support more sophisticated testing operations.

Although primarily depicted and described herein with respect to an exemplary implementation of the TISA in which the abstraction level is the Vector Level, it will be appreciated, by one skilled in the art and informed by the teachings herein, that the exemplary TISA implementation depicted and described herein may be modified such that the abstraction level of the TISA is the TAP Level or the Scan Segment Level.

Figure 5A:
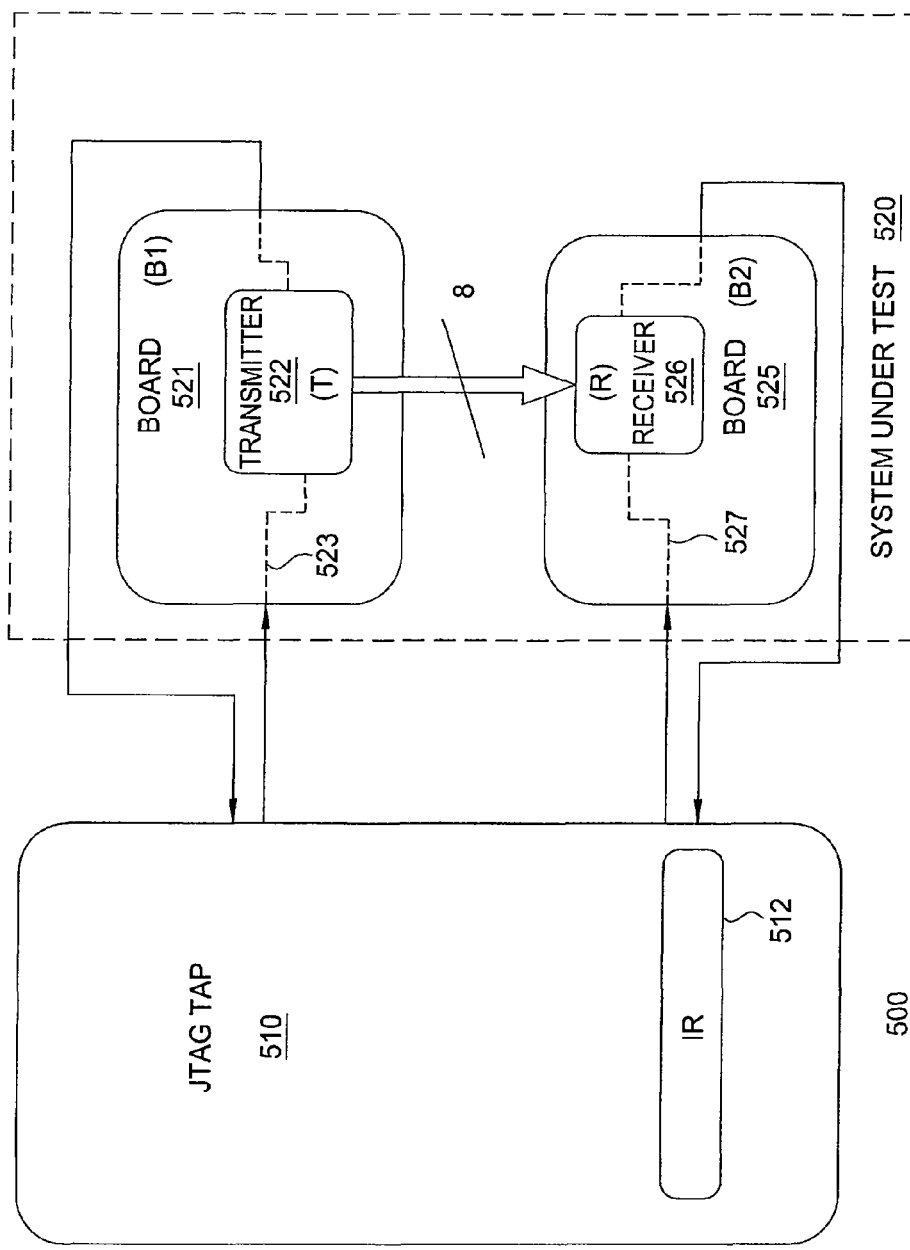
FIG. 5 depicts an implementation of the TISA using a SPARC V8 ISA, illustrating an exemplary TISA architecture for implementation of the TISA using a SPARC V8 ISA.
Figure 6:
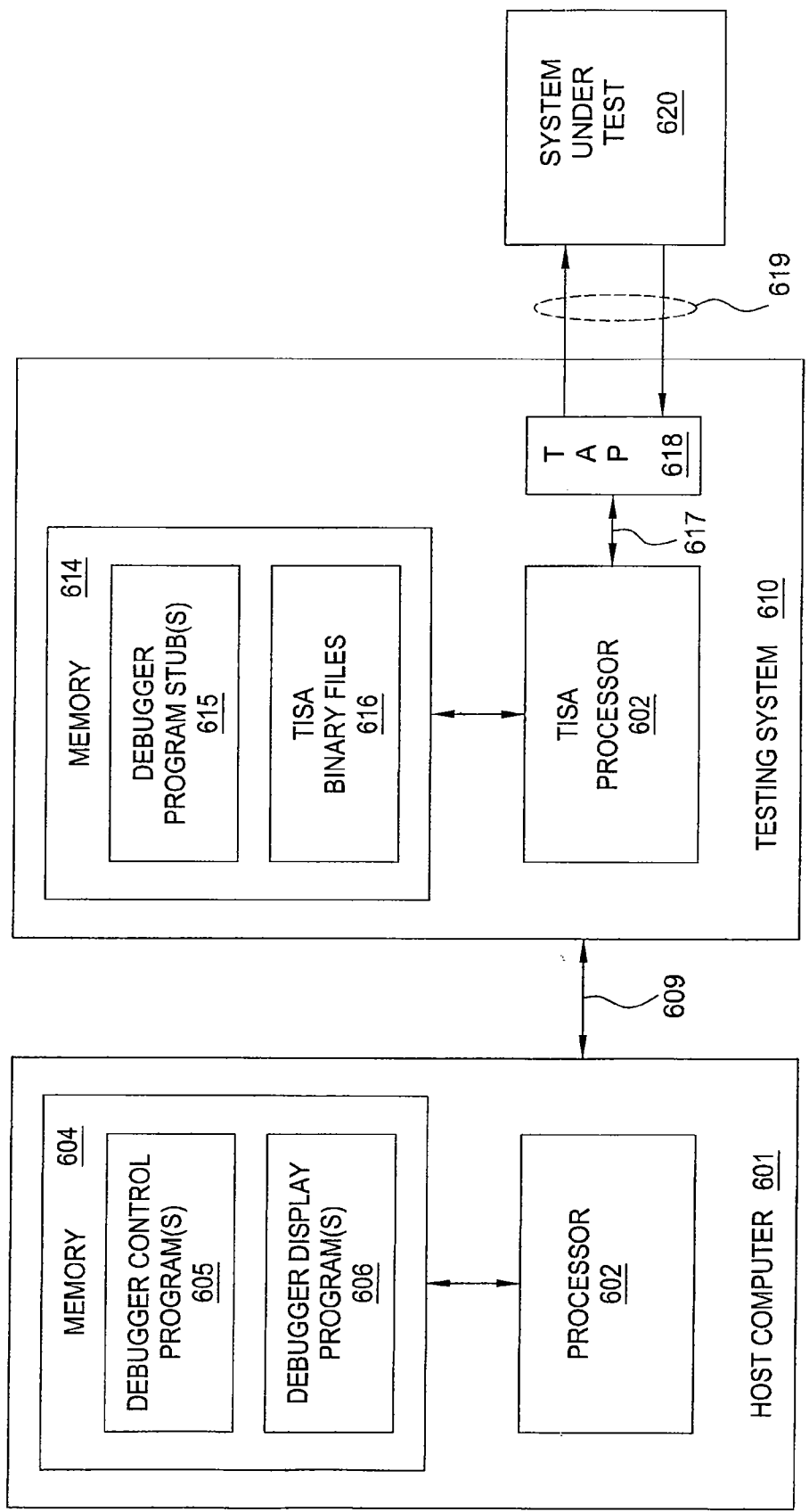
FIG. 6 depicts an embodiment of a TISA-based testing environment supporting interactive testing capabilities.

For purposes of clarity in describing the TISA, an exemplary use of the TISA to perform testing on an exemplary system under test is depicted and described herein with respect to FIGS. 5 and 6. In this exemplary use of the TISA, the TISA is implemented as a Vector Level TISA using a SPARC V8 ISA and SVF (i.e., in continuation of the exemplary implementation depicted and described with respect to FIGS. 4A-4E).

FIG. 5A and FIG. 5B depicts an exemplary use of the TISA to perform testing on a system under test.

FIG. 5A depicts a system test environment 500 including a JTAG TAP 510 and a system under test 520.

The JTAG TAP 510 provides test access to a system under test 520. The JTAG TAP 510 provides test access to the system under test 520, for sending input data to system under test 520 and receiving output data from system under test 520. The JTAG TAP 510 includes an instruction register (IR) 512, which is an 8-bit instruction register.

The JTAG TAP 510 is controlled by a testing system (e.g., such as testing system 110 depicted and described with respect to FIG. 3, which is omitted for purposes of clarity).

The system under test 520 includes a first board 521 (denoted as B1) and a second board 525 (denoted as B2). The first board 521 includes a transmitter 522 (denoted as T). The second board 525 includes a receiver 526 (denoted as R). The transmitter 522 sends data, on a connection 529, to receiver 526. In this example, the connection 529 is an 8-bit connection.

As depicted in FIG. 5A, each board is accessible from JTAG TAP 510 via its own scan chain. Namely, first board 521 is accessible via a first scan chain 523 and second board 525 is accessible via a second scan chain 527. The first scan chain 523 and second scan chain 527 are selectable by the IR 512 of JTAG TAP 510 (e.g., IR=0 selects first board B1, IR=1 selects second board B2). The transmitter 522 and the receiver 526 are not alone on their boards; rather, they are part of wider scan chains (e.g., for purposes of this example, 24 bits and 16 bits, respectively).

In a test program, input data is sent to transmitter 522 via the first scan chain 523, and the resulting output data is collected from the receiver 526 by exploiting the second scan chain 527. In order to perform an exhaustive test, all possible values are sent through the connection 529, such that $2^8=256$ vectors are sent through the connection 529. Using C, an exemplary program could be the following:

```
1   include <stdio.h>
2   include <jtag.h>
3
4   char sent_value, received value;
5
6   define MAX_COUNT 256;
7
8   void main(void)
9   {
10      for (sent_value=0;sent_value<MAX_COUNT;sent_value++)
11      {
12          apply_JTAG(sent_value,B1.T);
13          read_JTAG (received_value,B2.R);
14          if (sent_value != received value) exit (0);
15      }
16  exit(1);
17 }
```

In this program, line 2 includes the C module that is handling JTAG operations, where the functions "apply_JTAG" and "Read_JTAG", used in lines 12 and 13, respectively, are defined. The pre-compiler 330 of SC 320 recognizes these functions, and generates test operation description files 331 for TGT 310. The format of the test operation description files 331 may vary, depending on the actual implementation of first board 521 and second board 525. For example, if first board 521 and second board 525 both are IJTAG compliant, test operation description files 331 could be specified, for example, using New Scan Description Language (NSDL) code. The TGT 310, using test operation description files 331, generates TGT atomic test operations 316, which are translated, by TISA translator 340, into TISA atomic test operations 346. The TISA atomic test operations 346 are provided to front-end 324 of SC 320. The TGT atomic test operations 316, the associated TISA atomic test operations 346, and the resulting TISA binary code are depicted in FIG. 5B.

FIG. 5B depicts a mapping from C commands to TISA coding for use by a testing system performing testing of the system test environment 500 of FIG. 5A.

As depicted in FIG. 5B, the mapping from C commands to TISA coding is represented using a table 540 having four columns: a "C command" column 541, an "SVF instructions" column 542, a "TISA assembler" column 543, and a "TISA coding" column 544. The table 540, from left to right, illustrates the manner in which a C command can be translated into an SVF instruction, which can be translated into TISA assembler, which can be coded into TISA binary coding.

The Apply_JTAG(value,B1.T) command is translated into two SVF instructions: SIR 8 TDI(00) and SDR 24 TDI (value).

The SIR 8 TDI(00) SVF instruction is translated into TISA assembler as three operations:

SET 8, % cGENERIC1

SET 00, % cTDI

SIR TDI, which is translated into TISA coding as 12010000.

The SDR 24 TDI(value) SVF instruction is translated into TISA assembler as three operations:

SET 24, % cGENERIC1

SET value, % cTDI

SDR TDI, which is translated into TISA coding as 10010000.

The Read_JTAG(value,B2.R) command is translated into two SVF instructions: SIR 8 TDI(01) and SDR 16 ACTUAL (value).

The SIR 8 TDI(01) SVF instruction is translated into TISA assembler as three operations:

SET 8, % cGENERIC1

SET 01, % cTDI

SIR TDI, which is translated into TISA coding as 12010000.

The SDR 16 ACTUAL(value) SVF instruction is translated into TISA assembler as three operations:
SET 16, % cGENERIC1
SET "value", % cGENERIC2
SDR ACTUAL, which is translated into TISA coding as 10008000.

The TISA coding of the SET operations is not specified because the SPARC V8 Manual identifies them as "pseudo-instructions" which can have a different coding following the implementation of the processor.

Using the determined TISA codings, the pre-compiler 330 may now substitute the high-level JTAG accesses with their associated TISA assembler instructions. The result is the following code, specified using C, in which the calls to the JTAG TAP have been replaced by the associated TISA assembler coding:

```
1  include <stdio.h>
2  include <jtag.h>
3
4  char sent_value, received value;
5
6  define MAX_COUNT 256;
7
8  void main(void)
9  {
10      for (sent_value=0;sent_value<MAX_COUNT;sent_value++)
11      {
12          asm volatile ("SET 8, %cGENERIC1;
13              SET 00, %cTDI;
14              SIR TDI;
15              SET 24, %cGENERIC1;
16              SET &sent_value, %cTDI;
17              SDR TDI;");
18          asm volatile ("SET 8, %cGENERIC1;
19              SET 01, %cTDI;
20              SIR TDI;
21              SET 16, %cGENERIC1;
22              SET &received_value, %cGENERIC2;
23              SDR ACTUAL");
24          if (sent_value != received value) exit (0);
25      }
26      exit(1);
27 }
```

This code can be input into the front-end algorithms 322, which will generate the program model 323. The program model 323 can be input into the back-end algorithms 324, which will generate the executable TISA binary file(s) 355 including the TISA atomic operations 356.

The "TISA coding" column 544 of table 540 depicts the binary coding of the TISA assembler instructions (e.g., using the various rules defined with respect to the exemplary implementation of the TISA using a SPARC V8 ISA, as depicted and described with respect to FIGS. 4A-4E).

As described herein, the TISA provides complete freedom regarding test granularity in performing testing of a system under test (i.e., from TAP Level through Scan Segment Level). As depicted in FIG. 2 and FIG. 3, and further explained using the exemplary TISA implementation of FIGS. 4A-4E and FIGS. 5A-5B, test patterns may be computed using explicit queries by the Software Compiler to the Test Generation Tool, such that the only limit for the software algorithm is the resolution of the queries themselves.

As an example, at a coarse level, queries from the SC to the TGT may involve the entire scan chain of the system under test (e.g., such as in classical BSDL-based Boundary Scan testing).

As an example, at a fine level, queries from the SC to the TGT may involve registers or even bits. For example, dedicated Scan Segment primitives could significantly accelerate instrument access and TAP reconfiguration, boost code reuse, and provide various other advantages.

As an example, at a middle level somewhere between the coarse and fine levels, queries from the SC to the TGT may be done functionally (e.g., using standards such as IJTAG and other suitable standards, and using description languages such as NSDL and other suitable object-oriented description languages).

In this manner, the TISA does not force device/register access to be resolved at the model space (i.e., in the TGT), but, rather, allows developers to handle device/register access at the problem space (i.e., in the SC), thereby enabling developers to adapt the analysis grain to their needs and to the available resources.

Furthermore, in embodiments in which the TISA processor has sufficient resources, e.g., such as in the case of Automated Test Equipment (ATE), at least a portion of the circuit model may be implemented within the program model, thereby enabling the TISA machine to directly compute the vector patterns.

Furthermore, the TISA enables support for various other system test capabilities not previously possible without TISA, such as interactive testing including interactive debugging (locally and/or remotely), concurrency, portability, and the like, as well as various combinations thereof. These additional capabilities are now addressed in additional detail.

FIG. 6 depicts an embodiment of a TISA-based testing environment supporting interactive testing capabilities.

As depicted in FIG. 6, TISA-based testing environment 600 includes a host computer (HC) 601, a testing system (TS) 610, and a system under test (SUT) 620.

The HC 601 is configured to control TS 610 for controlling testing of SUT 620. The HC 601 includes a processor 602 coupled to a memory 604. The processor 602 and memory 604 may be any suitable processor and memory.

The memory 604 stores one or more debugger control programs 605. The debugger control program(s) enable HC 601 to trace and, where desired or necessary, alter, the execution of computer program(s) running on TS 610. For example, debugger control program(s) 605 may include one or more of the GNU Debugger (GDB), the dbx debugger, the Perl debugger, the Bash debugger, the Python debugger, and like suitable debugger programs, as well as various combinations thereof.

The memory 604 also may store one or more debugger display programs 606. The debugger display program(s) enable HC 601 to display information associated with the debugger control program(s) 605. The information associated with debugger control program(s) 605 may be displayed by debugger display program(s) 606 in any suitable manner (e.g., using one or more display devices). For example, debugger display program(s) 606 may include one or more of Insight (which is a graphical user interface to GDB), the Data Display Debugger (DDD, which provides a graphical user interface for various command-line debuggers, such as GDB and others), and like suitable debugger display programs, as well as various combinations thereof.

The TS 610 is controlled by HC 601 for purposes of testing SUT 620. The TS 610 is configured to function in a manner consistent with the TISA (e.g., such as depicted and described with respect to TS 110 of FIG. 1-FIG. 3) and, further, is configured to support interactive testing (e.g., by enabling access by debuggers running on HC 601).

The TS 610 includes a TISA processor 612 coupled to a memory 614. The TISA processor 612 may be implemented using any suitable processor, such as SPARC V8 (as depicted and described hereinabove with respect to FIGS. 4A-4E and FIG. 5), INTEL, and the like. The memory 604 may be any suitable memory.

The memory 614 stores one or more debugger program stubs 615. The debugger program stubs 615 understand the debugger protocol of the corresponding debugger control program(s) 605 running on HC 601, thereby enabling HC 601 to communicate with TS 610. For example, debugger stub(s) 615 may include one or more of GDB stub, a DBX stub, a Perl stub, a Bash stub, a Python stub, and like suitable debugger program stubs, as well as various combinations thereof.

The memory 614 stores TISA Binary Files 616. The TISA Binary Files 616 are generated by TS 610 in a manner as depicted and described herein with respect to FIG. 2 and FIG. 3. The TISA Binary Files 616 are executed by TISA processor 612 to perform testing on SUT 620.

The TS 610 also includes a Test Access Port (TAP) 618 coupled to TISA processor 612. The TAP 618 provides a test interface between TISA processor 612 and SUT 620 for enabling TISA processor 612 to perform testing of SUT 620 while being controlled by HC 601. The TAP 618 may be any suitable TAP (e.g., an 1149.1 TAP).

The TISA processor 612 interfaces with TAP 618 using an interface 617. The interface 617 may be any suitable interface between a TAP and a system under test (e.g., such as an interface that supports TCK, TMS, TDI, TDO, and, optionally, TRST, where TAP 618 is implemented as an 1149.1 TAP).

As depicted in FIG. 6, there is an interface 609 between HC 601 and TS 610. The interface 609 may support local communications and/or remote communications between HC 601 and TS 610. Thus, HC 601 may control interactive testing of SUT 620 via TS 610 locally and/or remotely.

For example, for local testing, interface 609 may be implemented as one or more of a Universal Asynchronous Receiver-Transmitter (UART) interface, serial interface, and the like, as well as various combinations thereof.

For example, for remote testing, interface 609 may be implemented using any suitable communications capabilities, such as Transmission Control Protocol (TCP)/Internet Protocol (IP) or any other suitable communications protocols. This enables remote testing in which the HC 601 and TS 610 may be separated by large geographical distances, and HC 601 will still be able to control TS 610 for purposes of performing testing of SUT 620.

In the TISA-based testing environment 600, the HC 601 is able to control, step-by-step, test execution on SUT 620, by controlling operation of TS 610 via a standard connection (e.g., UART, TCP/IP, and the like), thereby enabling interactive testing and debugging capabilities.

Although omitted for purposes of clarity, it will be appreciated that HC 601 and TS 610 may include various other components, such as additional processors, additional memories, internal communications buses, input/output modules, additional support circuits (e.g., power supplies), and the like, as well as various combinations thereof.

Although omitted for purposes of clarity, it will be appreciated that SUT 620 may be any system under test which may be tested using the TISA.

Although primarily depicted and described with respect to specific types of debugger control programs, debugger display programs, interfaces, and the like, it will be appreciated that TISA-based testing environment 600 may be implemented in a manner enabling fully-interactive testing capabilities using various other debugger control programs, debugger display programs, interfaces, and the like, as well as various combinations thereof.

Figure 7:
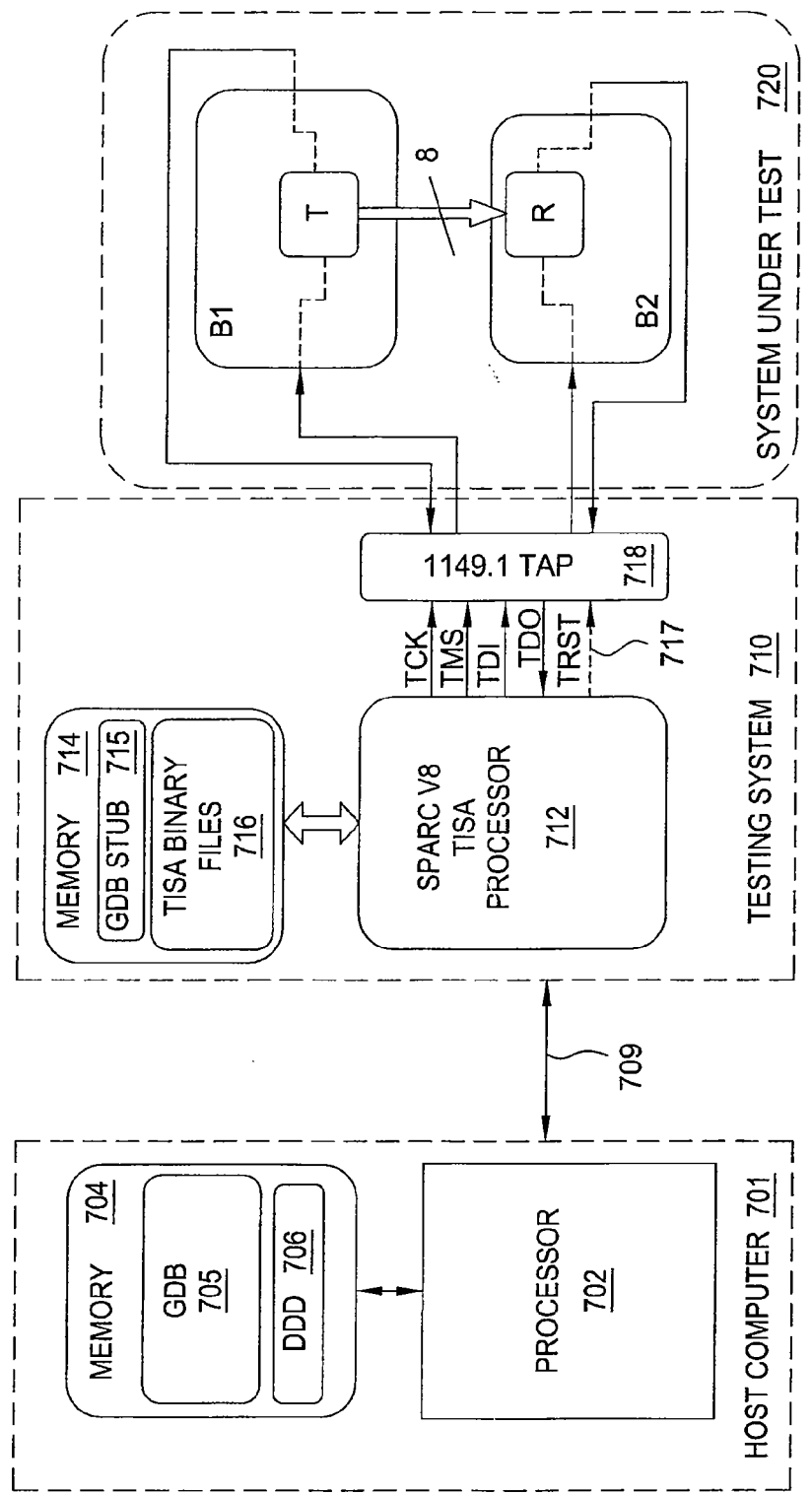
FIG. 7 depicts an exemplary implementation of the TISA-based testing environment of FIG. 6.

FIG. 7 depicts an exemplary implementation of the TISA-based testing environment of FIG. 6.

As depicted in FIG. 7, exemplary TISA-based testing environment 700 of FIG. 7 is an implementation of the TISA-based testing environment 600 of FIG. 6 in which the GNU Tool Suite is used to support interactive testing of the exemplary system testing environment 500 of FIG. 5A.

As depicted in FIG. 7, exemplary TISA-based testing environment 700 includes a host computer (HC) 701, a testing system (TS) 710, and a system under test (SUT) 720.

The HC 701 includes a processor 702 and a memory 704. The HC 701 of FIG. 7 is an implementation of HC 601 of FIG. 6, in which debugger control program(s) 605 is implemented using GDB (GDB 705) and debugger display program(s) 606 is implemented using DDD (DDD 706).

The TS 710 includes a TISA processor 712 and a memory 714. The TS 710 of FIG. 7 is an implementation of TS 610 of FIG. 6, in which the TISA processor 612 is implemented using a SPARC V8 ISA (denoted as SPARC V8 TISA processor 712), debugger program stub(s) 615 is implemented using a GDB stub (GDB stub 715), and the TISA Binary Files 616 are generated based on the SPARC V8 ISA associated with SPARC V8 TISA processor 712 (TISA Binary Files 716).

The TS 710 also includes a Test Access Port (TAP) 718 coupled to SPARC V8 TISA processor 712. The TS 710 of FIG. 7 is an implementation of TS 610 of FIG. 6, in which the TAP 618 is implemented using a 1149.1 TAP (1149.1 TAP 718).

The SPARC V8 TISA processor 712 interfaces with 1149.1 TAP 718 using an interface 717. The interface 717 is a standard 1149.1 interface that supports TCK, TMS, TDI, TDO, and, optionally, TRST.

The SUT 720 is the SUT 520 of FIG. 5A. The SUT 720 includes a transmitter and receiver on different boards, as in SUT 520 of FIG. 5A.

The 1149.1 TAP 718 provides a test interface between SPARC V8 TISA processor 712 and SUT 720 for enabling SPARC V8 TISA processor 712 to perform testing of SUT 720 while being controlled by HC 701.

As depicted in FIG. 7, there is an interface 709 between HC 701 and TS 710. The interface 709 may support local communications and/or remote communications (e.g., via a network) between HC 701 and TS 710. Thus, HC 701 may control interactive testing of SUT 720 via TS 710 locally and/or remotely.

In the exemplary TISA-based testing environment 700, the HC 701 is able to control, step-by-step, test execution on SUT 720, by controlling the operation of TS 710 via interface 709, thereby enabling interactive testing and debugging capabilities.

It will be appreciated that most of the left-hand side of FIG. 7 reuses existing Computer Science elements: namely, the entire HC 701, as well as the GDB stub 715 on TS 710. It is the same for the central part of FIG. 7, where analogies between HC 701 and TS 710 (as well as their associated sub-elements) are evident. The TISA allows this entire infrastructure to be leveraged to provide system testing.

As an example, in reference to the system test environment 500 of FIG. 5A (including the associated exemplary C programs, SVF instructions, TISA assembler instructions, and TISA codings), there are many interactive test operations that the TISA can enable by leveraging on GDB (or any other suitable debuggers), such as: (a) step-by-step execution while monitoring the variables "sent_value" and "received_value"; (b) on-the-fly modification of the value to be sent to the tap (variable "sent_value"); (c) modification of the looping end condition; (d) monitoring of all variables; and the like, as well as various combinations thereof. These interactive test operations are standard operations for GDB, and the TISA can directly use them, due to the ability of the TISA to automatically hand off control between the algorithmic and test access portions, as described hereinabove. In the absence of the TISA, special tooling would need to be developed and adapted to each hand-off implementation.

Although exemplary TISA-based testing environment 700 of FIG. 7 is primarily depicted and described herein with respect to using the GNU Tool Suite to support interactive testing of a specific system under test, it will be appreciated, by those skilled in the art and informed by the teachings herein, that interactive testing capabilities in a TISA-based test environment may be realized using any suitable tool suites for testing any type of system under test.

Although TISA-based testing environment 600 of FIG. 6 and exemplary TISA-based testing environment 700 of FIG. 7 are primarily depicted and described herein with respect to linear test procedures where testing is done step-by-step following a pre-determined algorithm (for purposes of clarity in describing the interactive testing capabilities that are enabled by TISA), it will be appreciated that other more complicated interactive testing scenarios are possible due to the leverage of Computer Science experience and techniques enabled by TISA. An example of a more complicated interactive testing scenario enabled by TISA is depicted and described herein with respect to FIG. 8. It will be appreciated that this is merely one example, and that one skilled in the art and informed by the teachings herein may use TISA in many other interactive testing scenarios and applications.

As described herein, in addition to supporting both granularity and interaction, the TISA also supports concurrency.

The TISA naturally and fully merges the system testing flow with the computer science software flow and, therefore, can leverage the best aspects of both flows. As an example, approaches such as STAPL have difficulty in handling concurrent control of instruments, because such approaches are, by definition, fully sequential. Furthermore, approaches such as the MTC and SystemBIST are intrinsically sequential and single-task and, thus, it would be difficult and awkward to program such approaches to support concurrency. By contrast, concurrent execution is a well-known problem in Computer Science and is now, for instance, at the base of all operating systems. A large number of libraries supporting concurrent execution are available (e.g., the POSIX suite, the BOOST suite, and the like), and most modern processors are designed to efficiently support multi-tasking and context-switching (e.g., the SPARC V8, for instance, implements a rotating register window). The natural interaction between the system testing flow and the computer science software flow that is enabled by the TISA allows the TISA to completely leverage such computer science approaches to concurrency.

The support of concurrency capabilities by the TISA may be better understood by way of an example. As an example, consider the problem of optimizing the data transfer rate of the T-R channel between the transmitter 522 and the receiver 526 of the system under test 520 of FIG. 5A and FIG. 7. This would involve transmitting a stream of data patterns from transmitter 522 on first board 521, receiving a corresponding stream of data patterns at receiver 526 on second board 525, and comparing the transmitted and received streams of data patterns to compute bit/error rates and to tune parameters of transmitter 522 and/or receiver 526 accordingly. This optimization may be performed efficiently using three programs operating concurrently.

Figure 8:
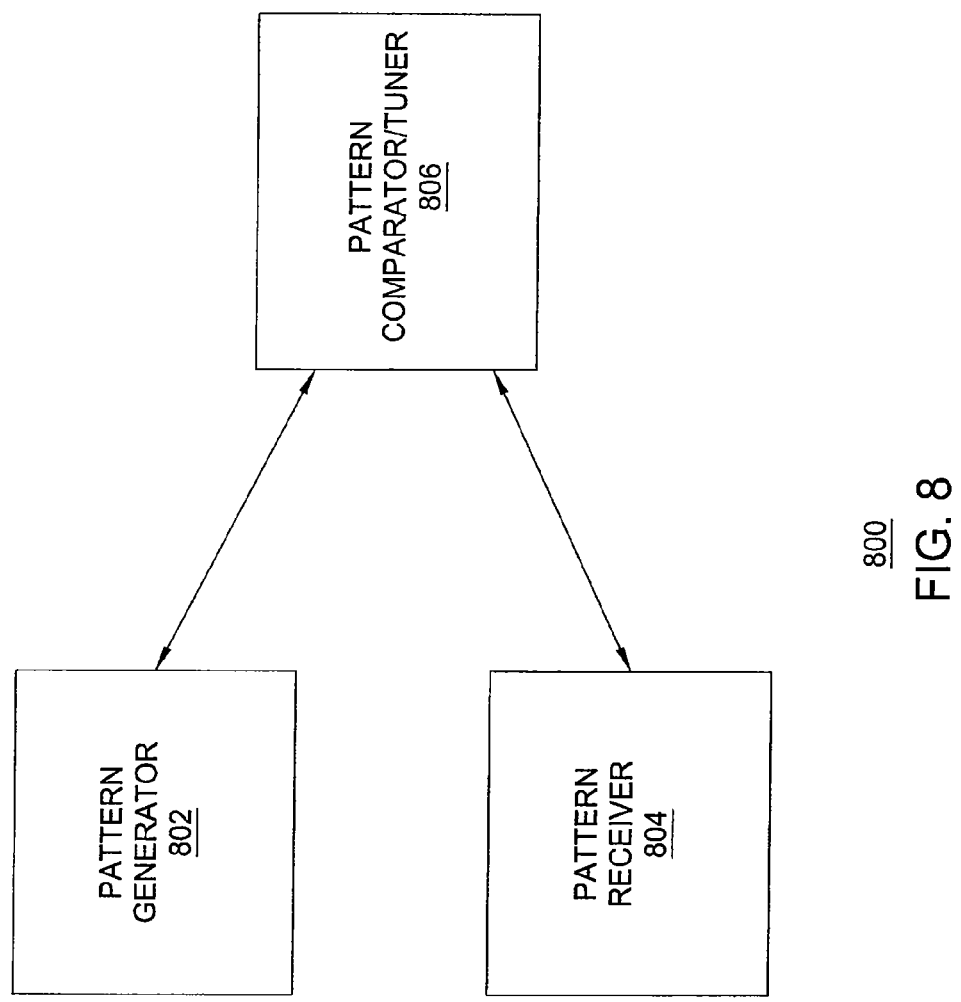
FIG. 8 depicts an exemplary program architecture for performing optimization of the transmitter-receiver channel of the system under test of FIG. 5A.

FIG. 8 depicts an exemplary program architecture for performing optimization of the transmitter-receiver channel of the system under test of FIG. 5A and FIG. 7.

As depicted in FIG. 8, exemplary program architecture includes a pattern generator 802, a pattern receiver 804, and a comparator 806. The pattern generator 802, pattern receiver 804, and comparator 806 cooperate to optimize the data transfer rate of the T-R channel between the transmitter 522 and the receiver 526 of the system under test 520 of FIG. 5A and FIG. 7.

The pattern generator 802 sends the appropriate input data patterns to the transmitter 522 (T) on first board 521. The pattern generator 802 can access the TAP (illustratively, TAP 510 in FIG. 5A, TAP 718 in FIG. 7) in order to provide the input data patterns to transmitter 522 via the scan chain 523 of first board 521 (B1). The pattern generator 802 may provide the input data patterns to the transmitter 522 in any suitable manner (e.g., as specified in lines 12-13 of the code described herein with respect to FIG. 5A). The input data patterns may be any data patterns suitable for optimizing the T-R channel between transmitter 522 and receiver 526. For example, the input data patterns may be pre-computed patterns, random patterns, and the like, as well as various combinations thereof.

The pattern receiver 804 collects the appropriate output data patterns from the receiver 526 (R) on second board 525. The pattern receiver 804 can access the TAP (illustratively, TAP 510 in FIG. 5A, TAP 718 in FIG. 7) in order to collect the output data patterns from receiver 526 via the scan chain 527 of second board 525 (B2). The pattern receiver 804 may collect the output data patterns from the receiver 526 in any suitable manner (e.g., as specified in lines 14-15 of the code described herein with respect to FIG. 5A).

The comparator 806 communicates with pattern generator 802 and pattern receiver 804. The comparator compares the input data patterns and the output data patterns. The comparator 806 evaluates the bit transmission rate and the bit error rate of the T-R channel and, based on the results of the comparison, can access the control registers of both the transmitter 522 and the receiver 526 (omitted from FIG. 5A and FIG. 7, for purposes of clarity) to optimize the parameters of the T-R channel.

In order to perform such an optimization testing procedure, pattern generator 802, pattern receiver 804, and comparator 806 need to work in parallel, and each must be able to access the TAP independently of the others. This type of control structure is very difficult to code in traditional environments, which are developed only to support one-point serial handoff control over the TAP. This type of control structure also is very difficult to code in environments employing MTC or other such approaches which also share the same serial TAP access paradigm. By contrast, the TISA is not designed with any such assumption regarding test access; rather, in the TISA, test access is handled in a manner similar to other processor resources, and test access instructions are mixed directly with classical ISA instructions. Using the TISA, the optimization testing procedure of FIG. 8 may be executed by any multitasking Operating System using standard constructs like processes, threads, inter-process communications (IPC), and the like, as well as various combinations thereof. In this manner, pattern generator 802, pattern receiver 804, and comparator 806 can share access to the TAP, and can resolve any eventual TAP sharing issues as is done for all processor resources, e.g., using well-known constructs and algorithms such as, for example, Dijkstra's semaphores. Thus, whereas existing system testing capabilities do not support concurrency, it is clear that the TISA easily and fully supports concurrency.

As described hereinabove, the TISA does not make any assumptions regarding the test access method or the associated test program partitioning; rather, test instructions are treated in the same manner, or substantially the same manner, as classical ISA instructions, without any a priori separation between the two. This enables the TISA to be completely compatible with all existing (and, most likely, future) computer science algorithms and constructs, something that no existing test processor approaches can support.

Thus, it will be appreciated that any existing software libraries can be ported into the TISA architecture. For example, it would be easy to obtain multitasking and concurrency (e.g., as depicted and described herein with respect to FIG. 8) by exploiting the POSIX and BOOST suites. Further, it will be appreciated that where the TISA is obtained as a generalization of an existing ISA (e.g., as depicted and described with respect to the exemplary SPARC V8 TISA implementation depicted and described with respect to the FIG. 5A and FIG. 5B), porting may not even be necessary since the ISA that the TISA has been developed from will already include such software libraries.

Furthermore, it will be appreciated that various other computer science techniques may be utilized for providing improved system testing using the TISA. For example, some examples of such computer science techniques which may be leveraged for the TISA include: (a) use of platform-independent coding styles, (b) use of ISA-to-ISA converters; (c) use of a Virtual Machine approach, e.g., like for Java, to obtain platform-independent bytecode, or even extension of the Java Virtual Machine itself to become a TISA; and (d) use of an Application Programming Interface (API) to standardize some TISA software interfaces, which would then be translated into primitives by the appropriate drivers. It will be appreciated that these examples are merely a few examples of computer science techniques which may be leveraged for the TISA.

Figure 9:
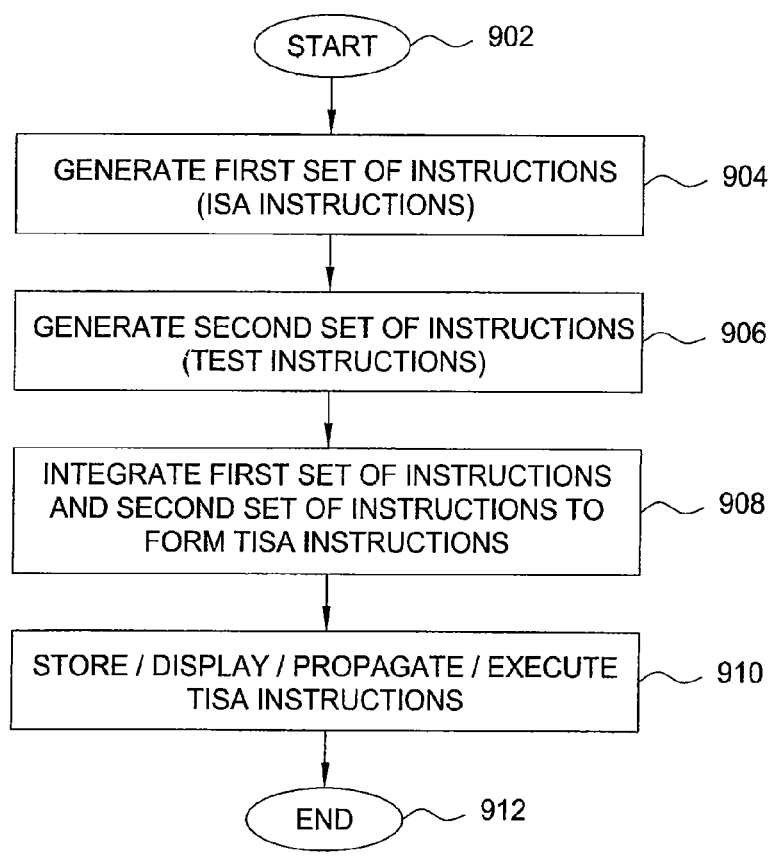
FIG. 9 depicts one embodiment of a method for adapting an Instruction Set Architecture (ISA) flow of a processor to form a Test Instruction Set Architecture (TISA) flow.

FIG. 9 depicts one embodiment of a method for adapting an Instruction Set Architecture (ISA) flow of a processor to form a Test Instruction Set Architecture (TISA) flow including TISA instructions adapted for use by the processor in testing at least a portion of a system under test.

Although primarily depicted and described herein as being performed serially, at least a portion of the steps of method 900 may be performed contemporaneously, or in a different order than depicted and described with respect to FIG. 9.

At step 902, method 900 begins.

At step 904, a first set of instructions is generated. The first set of instructions includes ISA instructions supported by the processor (i.e., ISA instructions being leveraged to provide the TISA for the processor).

At step 906, a second set of instructions is generated. The second set of instructions includes test instructions associated with the system under test. The second set of instructions may be generated in any suitable manner, e.g., as depicted and described with respect to TGT 210 of FIG. 2, as depicted and described with respect to TGT 310 of FIG. 3, and/or using any other suitable method of generating test instructions.

At step 908, the first set of instructions and the second set of instructions are integrated to form thereby TISA instructions. The TISA instructions provide the TISA for the processor.

At step 910, the TISA instructions are stored, displayed, propagated, and/or executed, or any combination thereof. The TISA instructions may be handled in any other suitable manner.

At step 912, method 900 ends.

Figure 10:
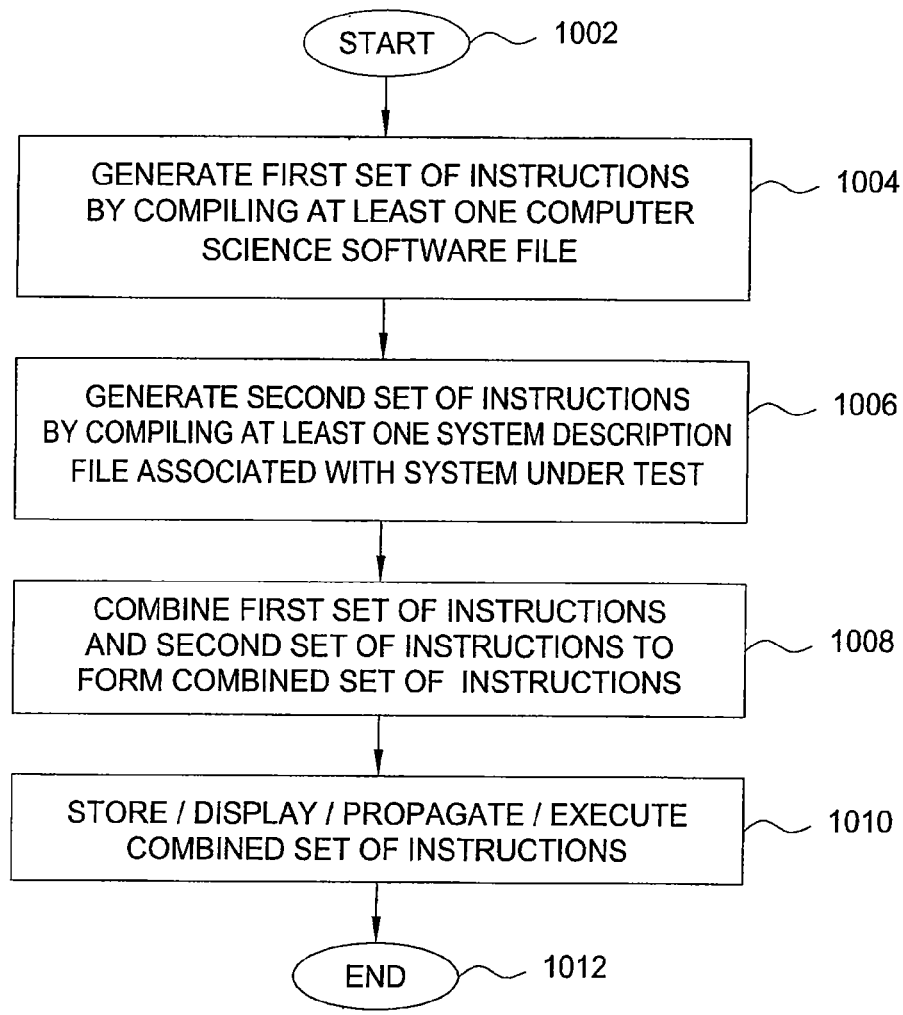
FIG. 10 depicts one embodiment of a method for generating instructions adapted for use in testing at least a portion of a system under test.
Figure 11A:
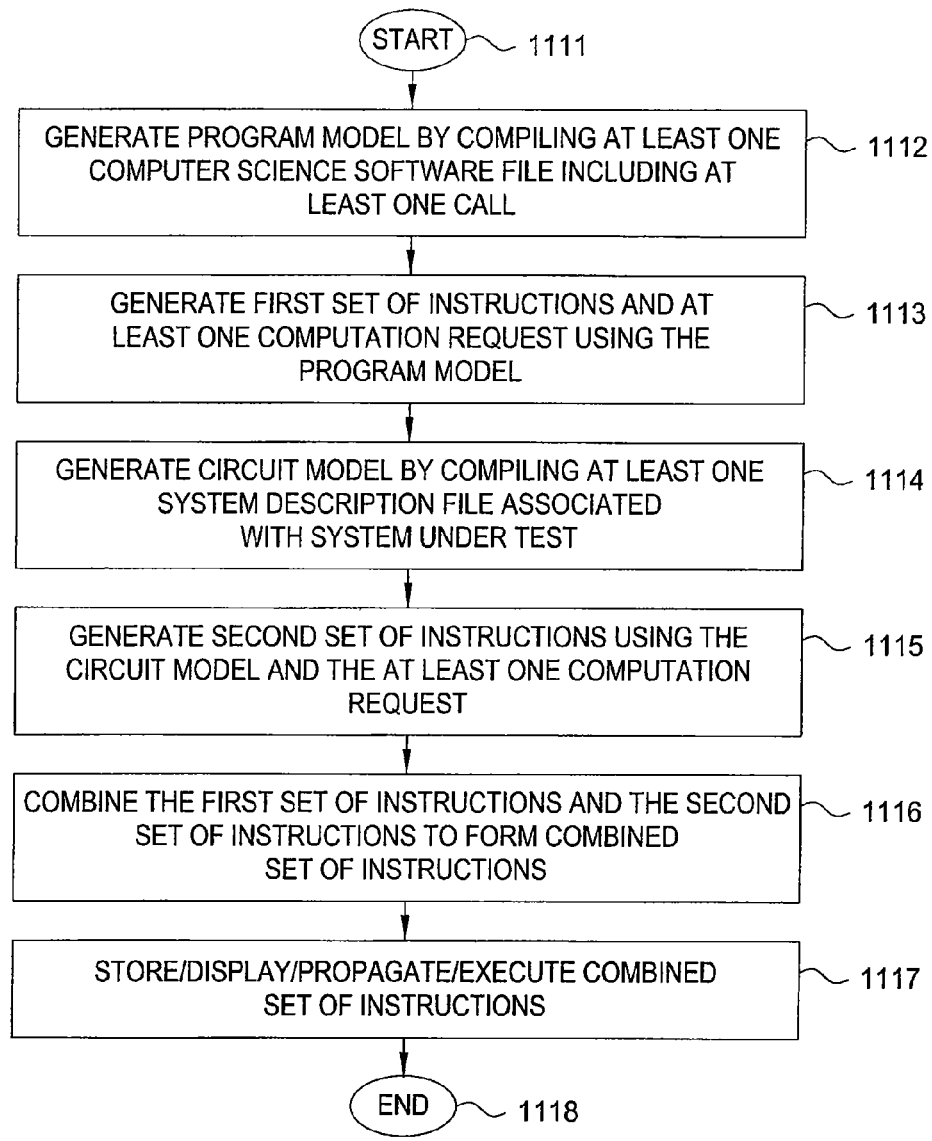
FIG. 11A depicts one embodiment of a method for generating instructions adapted for use in testing at least a portion of a system under test.
Figure 11B:
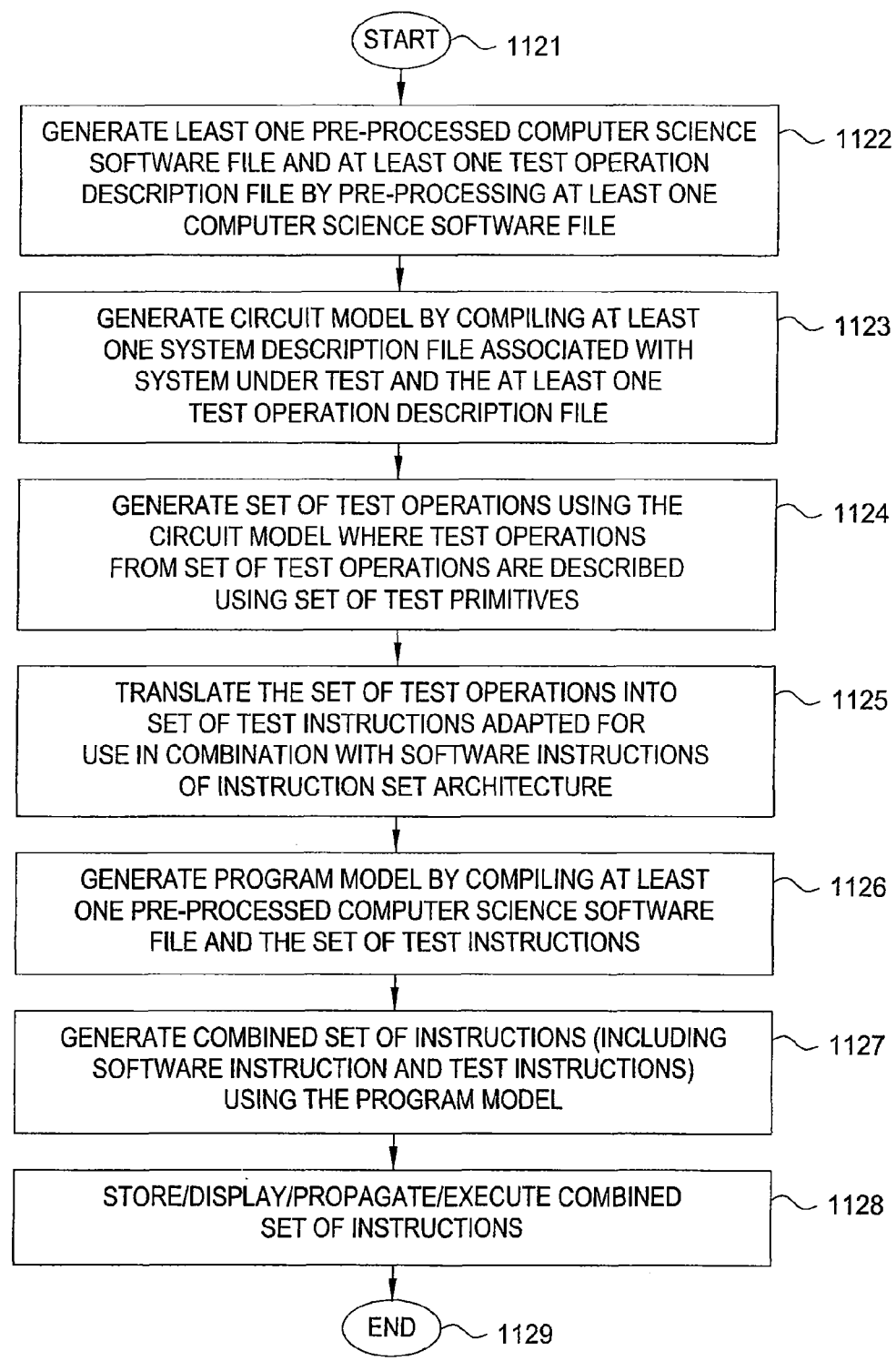
FIG. 11B depicts one embodiment of a method for generating instructions adapted for use in testing at least a portion of a system under test.

The TISA may be formed in any suitable manner, e.g., as depicted and described with respect to method 1000 of FIG. 10, as depicted and described with respect to the test system of FIG. 2 and associated method 1110 of FIG. 11A, as depicted and described with respect to the test system of FIG. 3 and associated method 1120 of FIG. 11B, and/or using any other suitable method of forming a TISA.

FIG. 10 depicts one embodiment of a method for generating instructions adapted for use in testing at least a portion of a system under test. Although primarily depicted and described herein as being performed serially, at least a portion of the steps of method 1000 may be performed contemporaneously, or in a different order than depicted and described with respect to FIG. 10. At step 1002, method 1000 begins.

At step 1004, a first set of instructions is generated. The first set of instructions includes instructions generated by compiling at least one computer science software file (e.g., ISA instructions of an ISA supported by a processor).

At step 1006, a second set of instructions is generated. The second set of instructions includes test instructions generated by compiling at least one description file associated with the system under test.

At step 1008, the first and second sets of instructions are combined to form a combined set of instructions. In the combined set of instructions, the instructions of the first set of instructions are adapted for use in controlling execution of the test instructions of the second set of instructions.

At step 1010, the combined set of instructions is stored, displayed, propagated, and/or executed, or any combination thereof. The combined set of instructions may be handled in any other suitable manner.

At step 1012, method 1000 ends.

FIG. 11A and FIG. 11B depict more detailed embodiments of the method 900 depicted and described with respect to FIG. 9 and/or the method 1000 depicted and described with respect to FIG. 10.

FIG. 11A depicts one embodiment of a method for generating instructions adapted for use in testing at least a portion of a system under test. Although primarily depicted and described herein as being performed in a specific sequence, at least a portion of the steps of method 1110 of FIG. 11A may be performed in a different order than depicted and described with respect to FIG. 11A. FIG. 11A may be better understood by viewing it in conjunction with FIG. 2 and the associated description of FIG. 2.

At step 1111, method 1000 begins.

At step 1112, a program model is generated. The program model is generated by compiling at least one computer science software file (e.g., ISA instructions of an ISA supported by a processor), where the at least one computer science software file includes at least one call.

At step 1113, a first set of instructions is generated. The first set of instructions is generated using the program model. At least one computation request also is generated using the at least one call included in the at least one computer science software file.

At step 1114, a circuit model is generated. The circuit model is generated by compiling at least one system description file associated with the system under test.

At step 1115, a second set of instructions is generated. The second set of instruction is generated using the circuit model and the at least one computation request.

At step 1116, the first and second sets of instructions are combined to form a combined set of instructions. In the combined set of instructions, the instructions of the first set of instructions are adapted for use in controlling execution of the test instructions of the second set of instructions.

At step 1117, the combined set of instructions is stored, displayed, propagated, and/or executed, or any combination thereof. The combined set of instructions may be handled in any other suitable manner.

At step 1118, method 1000 ends. FIG. 11B depicts one embodiment of a method for generating instructions adapted for use in testing at least a portion of a system under test. Although primarily depicted and described herein as being performed serially, at least a portion of the steps of method 1120 of FIG. 11B may be performed contemporaneously, or in a different order than depicted and described with respect to FIG. 11B. FIG. 11B may be better understood by viewing it in conjunction with FIG. 3 and the associated description of FIG. 3.

At step 1121, method 1100 begins.

At step 1122, at least one pre-processed computer science software file and at least one test operation description file are generated by pre-processing at least one computer science software file.

At step 1123, a circuit model is generated. The circuit model is generated by compiling at least one system description file associated with the system under test and the at least one test operation description file.

At step 1124, a set of test operations is generated. The set of test operations is generated using the circuit model. The test operations from the set of test operations are described using a set of test primitives (e.g., test primitives defined by a test generation tool which generates the circuit model). The set of test primitives includes test operations adapted for use in testing the system under test.

At step 1125, the set of test operations is translated into a set of test instructions by translating the test primitives of the set of test operations into test instructions adapted for use in combination with software instructions of an instruction set architecture.

At step 1126, a program model is generated. The program model is generated by compiling the at least one pre-processed computer science software file and the set of test instructions.

At step 1127, a combined set of instructions is generated. The combined set of instructions is generated using the program model. The combined set of instructions includes (a) software instructions determined from the at least one pre-processed computer science software file and (b) test instructions from the set of test instructions.

At step 1128, the combined set of instructions is stored, displayed, propagated, and/or executed, or any combination thereof. The combined set of instructions may be handled in any other suitable manner.

At step 1129, method 1120 ends.

Figure 12:
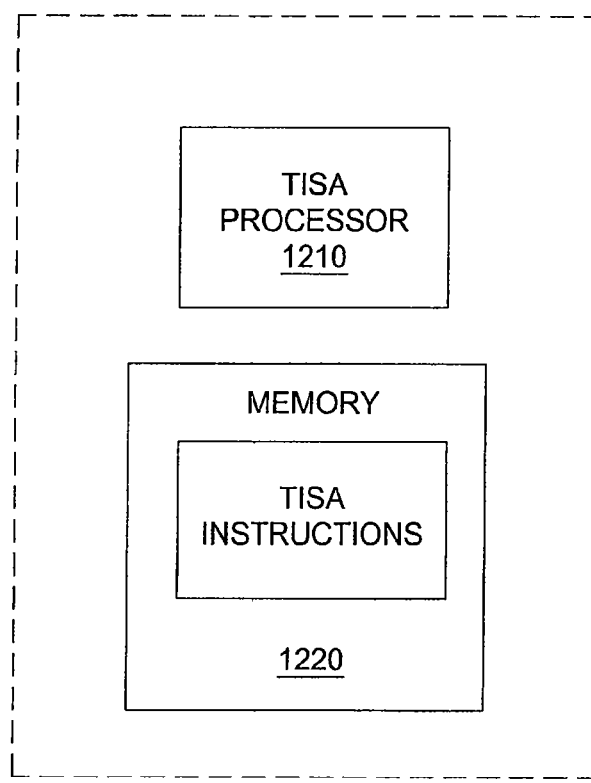
FIG. 12 depicts an exemplary embodiment of a TISA processor architecture.

FIG. 12 depicts an exemplary embodiment of a TISA processor architecture.

As depicted in FIG. 12, TISA processor architecture 1200 includes a TISA processor 1210 and a memory 1220.

The TISA processor 1210 may be any processor that is suitable for performing system testing using a TISA, such as a SPARC V8 processor, an INTEL processor, or any other suitable processor.

The memory 1220 may include any memory suitable for use by TISA processor 1210 to support system testing using a TISA, including one or more of random access memory, persistent memory, and the like, as well as various combinations thereof. The memory 1220 may store any information required for performing system testing using a TISA, such as test programs, TISA instructions, testing data, and the like, as well as various combinations thereof.

In one embodiment, for example, TISA processor architecture 1200 of FIG. 12 may support the TISA flows depicted and described with respect to FIG. 2 and FIG. 3.

In one embodiment, for example, TISA processor architecture 1200 of FIG. 12 may operate in a manner similar to TISA processor 612 and memory 614 of testing system 610 depicted and described with respect to FIG. 6. For example, TISA processor architecture 1200 of FIG. 12 may be implemented using a SPARC V8 TISA processor and associated memory, such as in the testing system 710 depicted and described with respect to FIG. 7. In such an embodiment, the TISA processor 1210 itself interprets and executes both the ISA and TISA instructions.

In one embodiment, an apparatus for use in testing at least a portion of a system under test via a Test Access Port (TAP) includes a memory for storing a set of instructions of a test instruction set architecture and a processor executing the set of instructions of the test instruction set architecture for testing at least a portion of the system under test via the TAP. The set of instructions of the test instruction set architecture includes a first set of instructions comprising a plurality of instructions of an Instruction Set Architecture (ISA) supported by the processor and a second set of instructions comprising a plurality of test instructions associated with the TAP, where the instructions of the first class of instructions and the instructions of the second class of instructions are integrated to form thereby the set of instructions of the test instruction set architecture.

In one embodiment, a TISA processor for use in testing at least a portion of a system under test via a Test Access Port (TAP) includes a first class of instructions including instructions of an Instruction Set Architecture (ISA) supported by the processor and a second class of instructions including test instructions associated with the TAP, wherein the ISA instructions of the first set of instructions and the test instructions of the second set of instructions are integrated to form a TISA adapted for testing at least a portion of the system under test.

In one embodiment, a computer processor, for testing a system under test (SUT) via a Test Access Port (TAP), includes circuitry configured to process instructions according to a test instruction set architecture (TISA) having semantics that enable interaction with the system under test via the TAP. The TISA includes a plurality of instructions of a first type and a plurality of instructions of a second type, where the first type of instructions include instructions of an instruction set architecture (ISA) supported by the computer processor and the second type of instructions include test instructions for testing the system under test via the TAP.

Although primarily depicted and described hereinabove with respect to embodiments in which the TISA processor is defined in a particular manner (e.g., using particular language to describe different classes and/or types of instructions), it will be appreciated that a TISA may be defined in other ways that are fully supported by the depiction and description of various TISAs as provided herein.

Although primarily depicted and described herein with respect to embodiments in which the TISA processor architecture is implemented using a single processor to support the TISA, in other embodiments the TISA processor architecture may be implemented using multiple processors.

Figure 13:
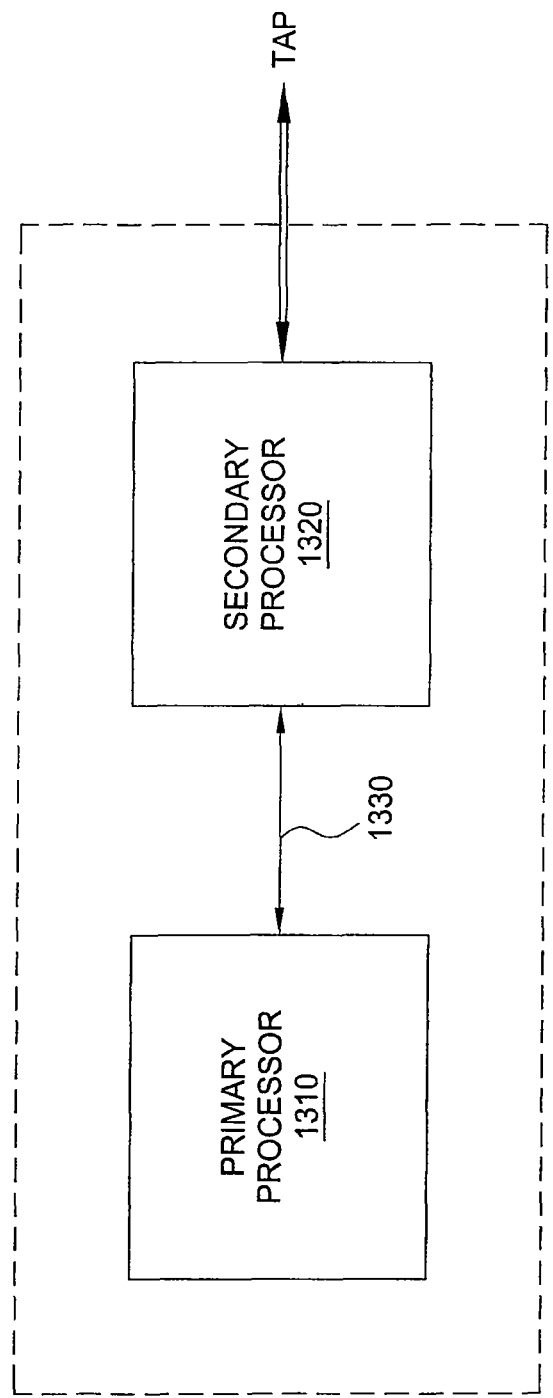
FIG. 13 depicts an exemplary embodiment of a test processor architecture utilizing multiple processors to provide system testing capabilities.

FIG. 13 depicts an exemplary embodiment of a test processor architecture utilizing multiple processors to provide system testing capabilities.

As depicted in FIG. 13, test processor architecture 1300 includes a primary processor 1310 and a secondary processor 1320 in communication via a communication path 1330.

The primary processor 1310 may be any processor suitable for supporting system testing, such as a SPARC V8 processor, an INTEL processor, or any other suitable processor. The primary processor 1310 executes instructions for testing a system under test. In one embodiment, for example, primary processor 1310 may support testing functions similar to the functions supported by CPU 1210 of TISA processor architecture 1200 of FIG. 12 (e.g., where test processor architecture 1300 utilizes a TISA). In one embodiment, for example, primary processor 1310 may support testing functions supported by testing processors in test processor architectures that do not utilize a TISA. The primary processor 1310 may support various other testing capabilities.

The secondary processor 1320 may be any processor suitable for supporting system testing, such as a SPARC V8 processor, an INTEL processor, or any other suitable processor. The secondary processor 1320 supports a Test Access Port (TAP) interface to the system under test (which is omitted for purposes of clarity). The TAP interface may interface with any suitable TAP. For example, the TAP interface may provide an interface to an IEEE 1149.1 TAP or any other suitable TAP which may be used for testing a system under test.

The primary processor 1310 and secondary processor 1320 cooperate to perform testing of at least a portion of a system under test.

The primary processor 1310 executes test instructions for testing a system under test. The test instructions may be test instructions of a TISA (where test processor architecture 1300 utilizes a TISA) or test instructions not associated with a TISA (where test processor architecture 1300 does not utilize a TISA). The primary processor 1310, during execution of the test instructions, detects instructions related to control of the TAP of the system under test (e.g., such as instructions for loading input data to a TAP controller of the system under test, instructions for reading output data from a TAP controller of the system under test, and like instructions, as well as various combinations thereof). The primary processor 1310 provides the TAP-related instructions to secondary processor 1320. The secondary processor 1320 receives the TAP-related instructions from primary processor 1310. The secondary processor 1320 executes the TAP-related instructions. The primary processor 1310 continues executing test instructions while secondary processor 1320 executes the TAP-related instructions received from primary processor 1310. In this manner, primary processor 1310 may perform a context switch and continue operating while secondary processor 1320 controls scan operations via the TAP of the system under test. This is difficult using a single-processor approach, because while the single processor is controlling the TAP, the single processor is prevented from performing other operations. Therefore, the use of multiple processors, as in the test processor architecture 1300, provides a significant improvement in testing efficiency without a need to use high-end processors, especially considering that operations over the TAP typically take a long time compared to the time required for a processor to perform a single operation.

The cooperation between primary processor 1310 and secondary processor 1320 to perform testing of at least a portion of a system under test is facilitated by communication path 1330. The communication path 1330 may be implemented using any suitable means of communication between primary processor 1310 and secondary processor 1320, which may depend on the type of multi-processor architecture with which the test processor architecture 1300 is implemented. For example, communication path 1330 may include one or more of a main processor interface bus, an auxiliary processor interface, a communication interface (e.g., such as a serializer-deserializer (SERDES) interface or other suitable communication interface), and the like, as well as various combinations thereof.

Although omitted for purposes of clarity, it will be appreciated that the test processor architecture 1300 will include memory (e.g., random access memory, persistent memory, cache memory, and the like, as well as various combinations thereof). The memory of test processor architecture 1300 may include one or more of memory shared by primary processor 1310 and secondary processor 1320, memory dedicated to primary processor 1310, memory dedicated to secondary processor 1320, and the like, as well as various combinations thereof.

Although omitted for purposes of clarity, it will be appreciated that the test processor architecture 1300 may include various other support circuits, such as buses, I/O circuits, and the like, as well as various combinations thereof.

The test processor architecture 1300 of FIG. 13 may be implemented in a number of ways.

In one embodiment, for example, the test processor architecture may use a test co-processor unit architecture in which a central processor unit (CPU) cooperates with a test co-processor unit (TCPU) in order to support system testing. An exemplary embodiment is depicted and described with respect to FIG. 14.

In one embodiment, for example, the test processor architecture may use a test adjunct processor unit architecture in which a central processor unit (CPU) cooperates with a test adjunct processor unit (TAPU) in order to support system testing. An exemplary embodiment is depicted and described with respect to FIG. 15.

Figure 14:
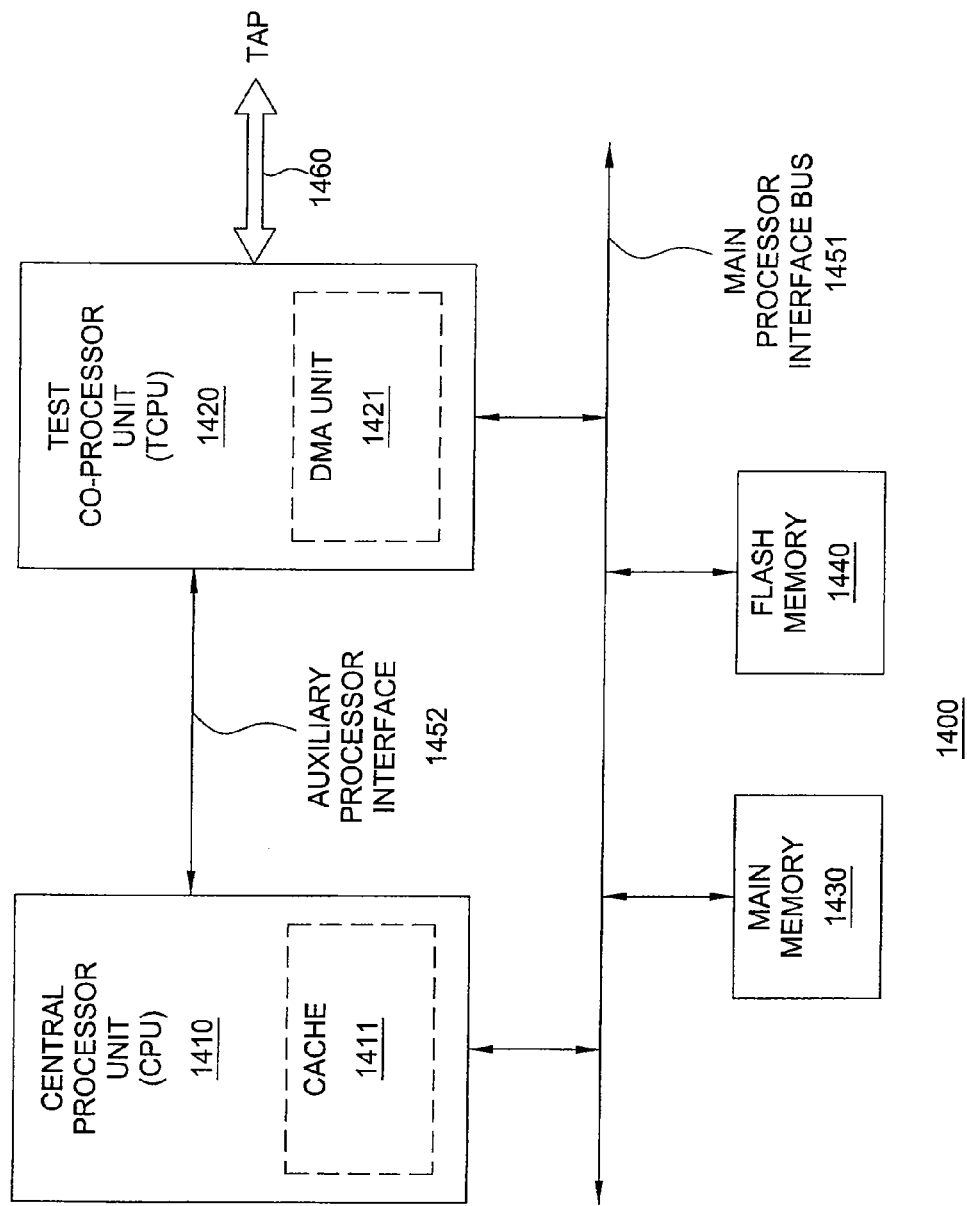
FIG. 14 depicts an exemplary embodiment of a test co-processor architecture.

FIG. 14 depicts an exemplary embodiment of a test co-processor architecture. The test co-processor architecture 1400 is suitable for use as a TISA processor architecture for supporting system testing using a TISA. The test co-processor architecture 1400 also is suitable for use as a test processor architecture for supporting system testing that does not employ a TISA.

The test co-processor architecture 1400 includes a central processor unit (CPU) 1410, a test co-processor unit (TCPU) 1420, a main memory 1430, and a flash memory 1440.

The test co-processor architecture 1400 includes a main processor interface bus 1451. The CPU 1410, TCPU 1420, main memory 1430, and flash memory 1440 each are coupled to (or otherwise configured to be able to communicate with) the main processor interface bus 1451.

The test co-processor architecture 1400 also may include an auxiliary processor interface 1452 which directly couples CPU 1410 and TCPU 1420, thereby enabling direct communications between CPU 1410 and TCPU 1420.

The CPU 1410 may be any CPU suitable for performing system testing of a system under test. The CPU 1410 supports testing capabilities supported by primary processor 1310 depicted and described with respect to FIG. 13.

The TCPU 1420 may be any CPU suitable for facilitating system testing of a system under test. The TCPU 1420 supports a Test Access Port (TAP) interface 1460, which may interface with any suitable TAP (e.g., such as an IEEE 1149.1 TAP or any other suitable TAP used for testing a system under test). The TCPU 1420 supports testing capabilities supported by secondary processor 1320 depicted and described with respect to FIG. 13.

The CPU 1410 and TCPU 1420 cooperate to perform testing of at least a portion of a system under test in a manner similar to primary processor 1310 and secondary processor 1320 depicted and described with respect to FIG. 13. The CPU 1410 and TCPU 1420 utilize instruction exception handling in order to enable CPU 1410 to continue operating to process test instructions while TCPU 1420 executes TAP-related instructions for controlling the TAP of the system under test during testing.

The CPU 1410 executes test instructions for testing a system under test. The CPU 1410, during execution of the test instructions, detects instruction exceptions (i.e., instructions related to control of the TAP of the system under test) and provides the instruction exceptions to TCPU 1420. The TCPU 1420 receives the instruction exceptions from CPU 1410 and processes the instruction exceptions such that the TCPU 1420 may handle the instruction exceptions while CPU 1410 continues to operate to perform other tasks (e.g., executing other testing instructions). In other words, CPU 1410 and TCPU 1420 cooperate during system testing such that CPU 1410 may switch context and continue to operate to perform other tasks while TCPU 1420 handles instruction exceptions detected by CPU 1410, thereby improving system testing efficiency.

In one embodiment, the CPU 1410 includes a cache 1411, e.g., for improving the performance of CPU 1410.

In one embodiment, the TCPU 1420 includes a direct memory access (DMA) unit 1421, which may be any type of DMA unit suitable for use in support system testing. In one embodiment, for example, DMA unit 1421 is a scatter/gather (S/G) DMA unit. The TCPU 1420 may utilize DMA unit 1421 for purposes of handling instruction exceptions received from CPU 1410, and for efficiently accessing sensible data stored in memory. In one embodiment, CPU 1410 may configure S/G DMA tables prior to encountering an instruction exception.

In one embodiment, the TCPU 1420 supports a set of specialized TCPU instructions. The set of specialized TCPU instructions may support TAP access and control. The set of specialized TCPU instructions may be used by TCPU 1420 to perform specific TAP operations on the TAP State Machine.

The CPU 1410 and TCPU 1420 utilize main memory 1430 and/or flash memory 1440 for performing various testing functions, such as execution of test instructions by CPU 1410, instruction exception handling by TCPU 1420, execution of TCPU instruction by TCPU 1420, and the like, as well as various combinations thereof. The main memory 1430 may be any suitable processor memory. The flash memory 1440 may be any suitable flash memory or any other suitable form of persistent memory. The CPU 1410 and TCPU 1420 share the memory with arbitrated access. The CPU 1410 and TCPU 1420 also may share the memory for purposes of exchanging information. Although primarily depicted and described with respect to specific numbers and types of memory, it will be appreciated that various other memory schemes may be used for supporting the functions performed by CPU 1410 and TCPU 1420.

The CPU 1410 and TCPU 1420 perform testing of the system under test using communication between CPU 1410 and TCPU 1420 and communication between CPU 1410 and/or TCPU 1420 and other components of test co-processor architecture 1400 (e.g., main memory 1430, flash memory 1440, and other components), and the like, as well as various combinations thereof. The communications may be supported using one or both of the main processor interface bus 1441 and the auxiliary processor interface 1452. The communications between CPU 1410 and TCPU 1420 may include communications associated with instruction exception notification, interrupt access, DMA arbitration, and the like, as well as various combinations thereof. The communications between CPU 1410 and TCPU 1420 and other components of the test co-processor architecture 1400 may include communications associated with reading from memory, writing to memory, and/or any other tasks which may be performed in support of testing the system under test.

Figure 15:
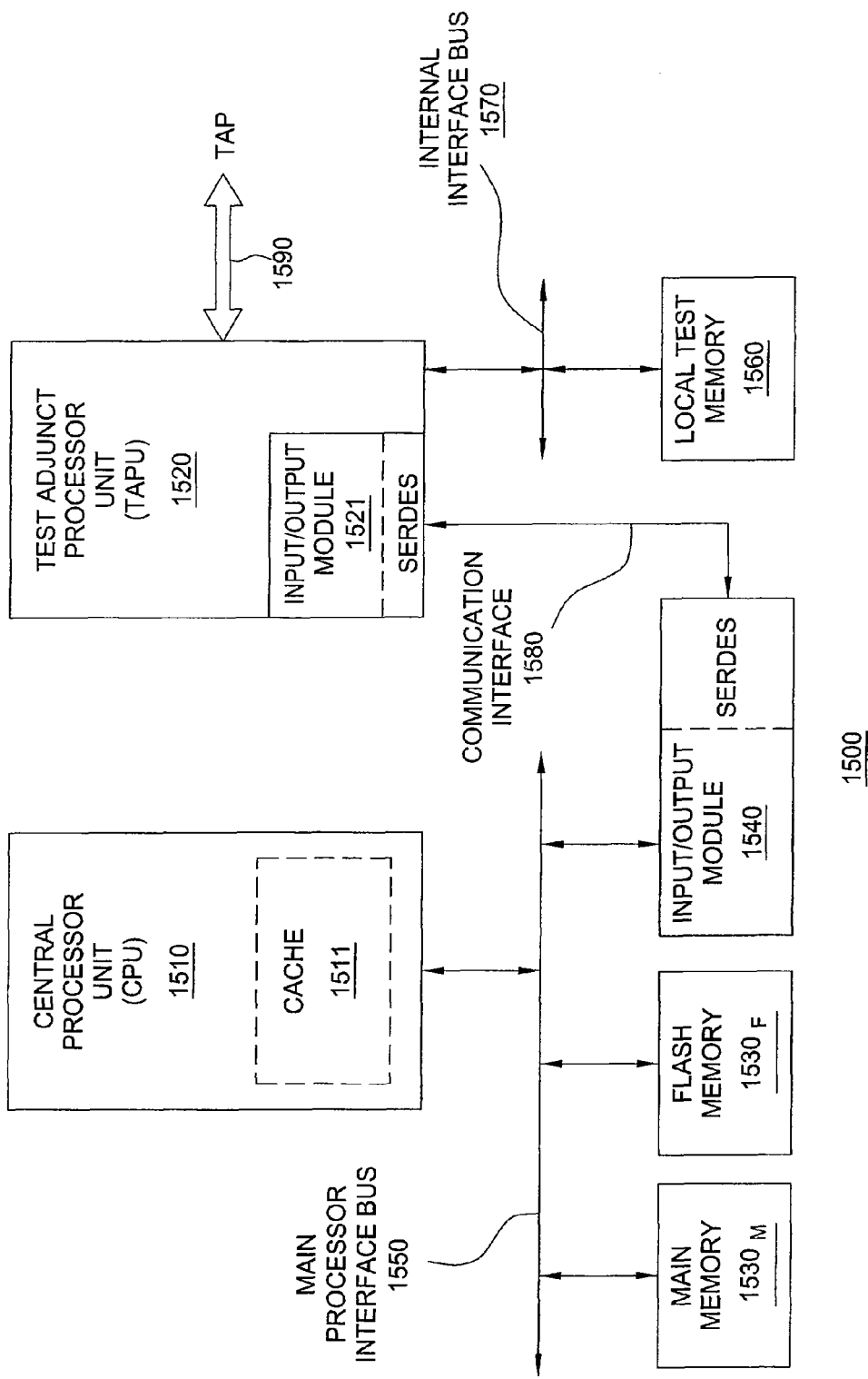
FIG. 15 depicts an exemplary embodiment of a test adjunct processor architecture.

FIG. 15 depicts an exemplary embodiment of a test adjunct processor architecture. The test adjunct processor architecture 1500 is suitable for use as a TISA processor architecture for supporting system testing using a TISA. The test adjunct processor architecture 1500 also is suitable for use as a test processor architecture for supporting system testing that does not employ a TISA.

The test adjunct processor architecture 1500 includes a central processor unit (CPU) 1510 and a test adjunct processor unit (TAPU) 1520. The CPU 1510 and TAPU 1520 may reside on the same board or may reside on different boards.

The CPU 1510 may be any CPU suitable for performing system testing of a system under test. The CPU 1510 supports testing capabilities supported by primary processor 1310 depicted and described with respect to FIG. 13.

The CPU 1510 has a main memory 1530$_M$, a flash memory 1530$_F$, and an input/output module 1540 associated therewith. The CPU 1510 has a main processor interface bus 1550 associated therewith. The CPU 1510, main memory 1530$_M$, flash memory 1530$_F$, and input/output module 1540 each are coupled to (or otherwise configured to be able to communicate with) the main processor interface bus 1550.

In one embodiment, the CPU 1510 includes a cache 1511, e.g., for improving the performance of CPU 1510.

The TAPU 1520 may be any CPU suitable for facilitating system testing of a system under test. The TAPU 1520 includes an input/output module 1521. The TAPU 1520 supports a Test Access Port (TAP) interface 1590, which may interface with any suitable TAP (e.g., such as an IEEE 1149.1 TAP or any other suitable TAP used for testing a system under test). The TAPU 1520 supports testing capabilities supported by secondary processor 1320 depicted and described with respect to FIG. 13.

The TAPU 1520 has a local test memory 1560 associated therewith. The TAPU 1520 has an internal interface bus 1570 associated therewith. The TAPU 1520 and local test memory 1560 each are coupled to (or otherwise configured to be able to communicate with) the internal interface bus 1570.

The input/output module 1540 associated with CPU 1510 and the input/output module 1521 of TAPU 1520 support a communication interface 1580 enabling communications between CPU 1510 and TAPU 1520. The communication interface 1580 supports streaming of TAP-related commands from CPU 1510 to TAPU 1520.

In one embodiment, the input/output module 1540 associated with CPU 1510 and the input/output module 1521 of TAPU 1520 support Serializer-Deserializer (SERDES) communications capabilities and, therefore, the communications interface 1580 is a SERDES-based communications interface. In this embodiment, the SERDES-based communications interface 1580 may be implemented using any suitable SERDES communications protocol (e.g., such as Gigabit Ethernet (GigE), Serial Rapid IO (SRIO), Peripheral Component Interconnect Express (PCIe), and the like). Although primarily depicted and described herein with respect to using SERDES-based communications between the CPU 1510 and the TAPU 1520, other suitable communications capabilities may be used in order to support communications between CPU 1510 and TAPU 1520.

The CPU 1510 and TAPU 1520 cooperate to perform testing of at least a portion of a system under test in a manner similar to primary processor 1310 and secondary processor 1320 depicted and described with respect to FIG. 13. The CPU 1510 and TAPU 1520 utilize command streaming via the communication interface 1580 in order to enable CPU 1510 to continue operating to process test instructions while TAPU 1520 executes TAP-related instructions for controlling the TAP of the system under test during testing.

The CPU 1510 executes test instructions for testing a system under test. The CPU 1510, during execution of the test instructions, detects instructions related to control of the TAP of the system under test. The CPU 1510 propagates the TAP-related instructions to the TAPU 1520 via the communication interface 1580 (i.e., from CPU 1510 to input/output module 1540 via the main processor interface bus 1550, for propagation via communication interface 1580). The TAPU 1520 receives the TAP-related instructions from CPU 1510 and processes the TAP-related instructions such that the TAPU 1520 may handle control of the TAP while CPU 1510 continues to operate to perform other tasks (e.g., executing other testing instructions). In other words, CPU 1510 and TAPU 1520 cooperate during system testing such that CPU 1510 may switch context and continue to operate to perform other tasks while TAPU 1520 handles TAP-related instructions detected by CPU 1510, thereby improving system testing efficiency.

In one embodiment, the TAP-related instructions detected by CPU 1510 and processed by TAPU 1520 are packetized by the CPU 1510 for propagation to TAPU 1520.

In one embodiment, the TAP-related instructions detected by CPU 1510 and processed by TAPU 1520 include opcodes supported by TAPU 1520. In one such embodiment, the TAP-related instructions also may include one or more extension commands adapted for use in performing block memory copies between memory associated with the CPU 1510 and memory associated with the TAPU 1520 (e.g., between main memory 1530$_M$ and local test memory 1560).

The CPU 1510 utilizes main memory 1530$_M$ and/or flash memory 1530$_F$ for performing various testing functions, such as execution of test instructions, detection of TAP-related instructions, packetization of TAP-related instructions, and the like, as well as various combinations thereof. The main memory 1530$_M$ may be any suitable processor memory. The flash memory 1530$_F$ may be any suitable flash memory or any other suitable persistent memory.

The TAPU 1520 utilizes local test memory 1560 for performing various testing functions, such as storage of TAP-related instructions received from CPU 1510, processing of TAP-related instructions received from CPU 1510, and the like, as well as various combinations thereof. The local test memory 1560 may be any suitable processor memory. In one embodiment, the local test memory 1560 may be relatively small since it handles processing of scan chain segments of the scan chain of the system under test, rather than the entire scan chain (as may be required in an on-chip memory).

Although primarily depicted and described with respect to specific numbers and types of memory, it will be appreciated that various other memory schemes may be used for supporting the functions performed by CPU 1510 and TCPU 1520.

Although primarily depicted and described herein with respect to use of a co-processor architecture or an adjunct processor architecture to implement the TISA, it will be appreciated that the TISA may be implemented using any suitable processor architecture, which may include processor architectures other than the co-processor architecture or the adjunct processor architecture. Thus, the TISA processor architecture may be implemented using multiple processors in various other ways, at least some of which may include use of more than two processors for supporting the TISA.

Although primarily depicted and described herein with respect to use of the co-processor architecture or the adjunct processor architecture in order to implement the TISA architecture, it will be appreciated by one skilled in the art and informed by the teachings herein that the co-processor architecture and the adjunct processor architecture each may be used to implement other types of testing architectures (i.e., other testing architectures that do not employ TISA).

It will be appreciated that the test co-processor architecture and the test adjunct processor architecture are functionally similar in that each enables a TISA to be executed by two communicating processors. In a given application, the choice between the two architecture may be made by the designer on the basis of implementation-dependent parameters, such as available resources, costs, performances, physical constraints (integration in the same chip, in different chips and/or boards or any combination thereof), as well as any other implementation parameter. Although primarily depicted and described herein with respect to test co-processor and test adjunct processor architectures, it will be appreciated by one skilled in the art and informed by the teachings herein that these implementation considerations will apply to any other types of testing architectures/infrastructure.

The TISA processor architectures depicted and described herein may employ any suitable TISA for use in performing system testing.

A description of one exemplary embodiment of a TISA adapted for use with the TISA processor architectures follows. This exemplary embodiment of a TISA is an implementation of Scan Segment Level primitives depicted and described herein. In a Scan Segment Level abstraction level, the overall scan chain of the system-under-test is divided into segments, which are then used as the data atom of the algorithm. It will be appreciated that the system-under-test may be partitioned into the scan segments by the algorithm developer, which may be a human and/or an automated tool. A more general description of the use of TISA to enable scan operations to be performed at the Scan Segment Level, i.e., a description that is independent of this exemplary TISA implementation, is provided detail hereinbelow.

The following embodiment of a TISA proposes a set of registers and instructions able to define and handle those scan segments. The following embodiment is based on a 32-bit sized TISA, but it could be adapted to any other word size (e.g., 16-bit, 64-bit, or any other suitable word size).

FIG. 16 depicts an exemplary register set that can be used by a TISA processor. The exemplary TISA includes the four register sets (denoted as register sets R1 through R4), which are depicted in FIGS. 16A-16D, respectively.

As depicted in FIG. 16A, the first register set R1 includes the following User Accessible Data Registers:

StatusRegister: 32-bit register containing status state information;

ControlRegister: 32-bit register containing command encodings;

BlockRegister: 32-bit register containing the offset in memory to preformatted data structures indirectly pointing to the scan data in (gather data) and where to write the data out (scatter data) [Used for all scan and compare operations for accessing Scatter/Gather Segment Descriptions];

ScanLengthRegister: 32-bit register where the current number of bits remaining to be scanned resides (also automatically populated from Scatter/Gather Segment Descriptions for block mode opcodes);

ScanStateRegister: 32-bit register containing 3 banks of 4 bits representing the startState, scanState, and endState of a scan operation. The 4 bits represent the encoding of the 16 states of the TAP state machine. (also populated from Scatter/Gather Segment Descriptions in block mode); and UserDataRegisters[1-11]: 32-bit registers containing scan segment data for small scan operations and data reuse (may be source or destination register).

As depicted in FIG. 16B, the second register set R2 includes the following Internal Scratch Registers:

BlockPointerRegister: 32-bit register pointing to the current Scatter/Gather Segment Description reference to be processed during Multiple Scan Instructions;

BlockCountRegister: 32-bit register containing the count of Scatter/Gather Segment Descriptions to be processed during Multiple Scan Instructions; and InstructionRegister: 32-bit register where the current opcode is placed for decoding.

As depicted in FIG. 16C, the third register set R3 includes the following Scatter/Gather Segment Descriptions registers:

BlockOffsetField: 32-bit number describing the bank of address when 64-bit architectures are used;

ScanLengthField: 32-bit integer specifying the number of bits to scan for this segment;

StateTraversalField: 3 fields of 4 bits each that represent the start state, scan state, and end state for this scan operation (each 4 bits represent the 16 state TAP State Machine states);

SourceLocationField: 32-bit base address for where the TDI data resides in memory;

DestinationLocationField: 32-bit base address for where the TDO data will be stored in memory;

ExpectedValueField: 32-bit address for where the expected vector resides in memory;

ResponseLocationField: 32-bit base address for where the captured TDI data resides in memory;

MaskField: 32-bit base address for where the MASK data used to limit the comparison operation resides in memory;

ResultLocationField: 32-bit base address for where the results of the comparison will be stored in memory.

As depicted in FIG. 16D, the fourth register set R4 includes the following MultiBlock Scatter/Gather Segment Descriptions registers:

BlockOffsetField: 32-bit number describing the bank of address when 64-bit architectures are used;

BlockCountField: 32-bit number defining the number of scan segments that are represented by this MultiBlock scan (used to initialize the BlockCountRegister during a MultiBlock scan operation);

ScatterGatherOpcodeField: 32-bit command opcode used for the Scatter/Gather Segment Description pointed to by the associated ScatterGatherBlockField; and ScatterGatherBlockField: 32-bit address for where the Scatter/Gather Segment Description associated with the previous ScatterGatherOpcodeField is located in memory.

It will be appreciated that the exemplary TISA register sets may be modified in any suitable manner. For example, each of the exemplary register sets may be modified to include fewer, more, and/or different registers. For example, the exemplary registers may be regrouped into fewer, more, and/or different sets. For example, fewer, more, and/or different register sets may be used. In other words, the exemplary TISA register sets may be replaced with any other TISA register set(s) suitable for use with TISA instructions sets to implement a TISA processor architecture.

The exemplary TISA may employ any suitable TISA instruction set (i.e., command dictionary) for use in performing system testing.

The exemplary TISA instruction set includes the following opcodes, which may be utilized to manipulate register sets R1 through R4 depicted and described with respect to FIGS. 16A-16D, as well as the original ISA register sets depicted and described herein:

StateTransition <TMS Value>, <TCK cycles>
This opcode is used to traverse the TAP state machine using the value of TMS for the given number of TCK clock cycles. This opcode is used to perform general state transitions between states of the TAP state machine. The <TMS Value> represents a single bit, while the <TCK cycles> represents the remaining data bits of the opcode.

RunTest <startState>, <testState>, <endState>
This opcode is used to transition from <startState> to <testState>, and to loop in <testState> for the number of TCK cycles as specified by the ScanLengthRegister. This opcode is used to transition to the <endState> as the conclusion of looping.

ScanRegister <source register>, <destination register>[, <expected register>] [,<mask register>]
This opcode is used to scan the data in the user data register <source register> and store the captured value into the user data register <destination register>. If the <expected_register> is present, compare captured data with it and raise error accordingly, eventually using the <mask_register>, if present. The number of bits scanned is defined in the ScanLengthRegister (0<=n<32). The start, scan, and end states are defined in the ScanStateRegister.

ScanRegisterZero <destination register>[,<expected register>] [,<mask register>]
This opcode is used to scan the vector value of all "0" and store the captured value into the user data register <destination register>. The number of bits scanned is defined in ScanLengthRegister (0<=n<32). The start, scan, and end states are defined in the ScanStateRegister.
<expected_register> and <mask_register> are used as in the ScanRegister instruction.

ScanRegisterOne <destination register>[,<expected register>] [,<mask register>]
This opcode is used to scan the vector value of all "1" and store the captured value into the user data register <destination register>. The number of bits scanned is defined in ScanLengthRegister (0<=n<32). The start, scan, and end states are defined in the ScanStateRegister.
<expected_register> and <mask_register> are used as in the ScanRegister instruction.

ScanBlock
This opcode is used to scan the data pointed to by the BlockRegister to the SUT starting at the <startState>, scanning the data in the <scanState>, with the <endState> finalizing the operation state as defined by the Block's StateTraversalField. The ScanStateRegister is populated with the data from the StateTraversal Field prior to the scan operation. The ScanLengthRegister is populated with the data from the ScanLengthField prior to the scan operation. No data from TDO is preserved. If the ExpectedValueField and Maskfield are set, comparison and error generation are done accordingly.

ScanBlockCapture

This opcode is used to scan the data pointed to by the BlockRegister to the SUT starting at the <startState>, scanning the data in the <scanState>, with the <endState> finalizing the operation state as defined by the Block's StateTraversalField. The ScanStateRegister is populated with the data from the StateTraversal Field prior to the scan operation. The ScanLengthRegister is populated with the data from the ScanLengthField prior to the scan operation. The data captured from TDO is preserved. If the ExpectedValueField and Maskfield are set, comparison and error generation are done accordingly.

ScanBlockZeroCapture

This opcode is used to scan the data vector of all "0" to the SUT starting at the <startState>, scanning the data in the <scanState>, with the <endState> finalizing the operation state as defined by the Block's StateTraversalField capturing the result in the register defined to by the BlockRegister. The ScanStateRegister is populated with the data from the StateTraversal Field prior to the scan operation. The ScanLengthRegister is populated with the data from the ScanLengthField prior to the scan operation. If the ExpectedValueField and Maskfield are set, comparison and error generation are done accordingly.

ScanBlockZero

This opcode is used to scan the data vector of all "0" to the SUT starting at the <startState>, scanning the data in the <scanState>, with the <endState> finalizing the operation state as defined by the Block's StateTraversalField without capturing the result. The ScanStateRegister is populated with the data from the StateTraversal Field prior to the scan operation. The ScanLengthRegister is populated with the data from the ScanLengthField prior to the scan operation. If the ExpectedValueField and Maskfield are set, comparison and error generation are done accordingly.

ScanBlockOneCapture

This opcode is used to scan the data vector of all "1" to the SUT starting at the <startState>, scanning the data in the <scanState>, with the <endState> finalizing the operation state as defined by the Block's StateTraversalField capturing the result in the register defined to by the BlockRegister. The ScanStateRegister is populated with the data from the StateTraversal Field prior to the scan operation. The ScanLengthRegister is populated with the data from the ScanLengthField prior to the scan operation. If the ExpectedValueField and Maskfield are set, comparison and error generation are done accordingly.

ScanBlockOne

This opcode is used to scan the data vector of all "1" to the SUT starting at the <startState>, scanning the data in the <scanState>, with the <endState> finalizing the operation state as defined by the Block's StateTraversalField without capturing the result. The ScanStateRegister is populated with the data from the StateTraversal Field prior to the scan operation. The ScanLengthRegister is populated with the data from the ScanLengthField prior to the scan operation. If the ExpectedValueField and Maskfield are set, comparison and error generation are done accordingly.

The exemplary TISA instruction set includes the following register modification instructions that use explicit values:

LoadRegisterExplicit <const value>, <register name>

This instruction loads the constant value of <const value> into the register named by <register name>.

CopyRegister <source register>, <destination register>

This instruction copies the contents of the register named as <source register> into the register named by <destination register>.

The exemplary TISA instruction set includes the following register modification instruction that use implicit values:

LoadRegisterImplicit <user data register>, <register name>

This instruction uses the value in the named <user data register> as a pointer reference to a memory location where the real data resides and stores the referenced value into the register named by <register name>

The exemplary TISA instruction set includes the following register preservation instructions:

StoreRegisterImplicit <register name>, <user data register>

This instruction uses the value in the named <user data register> as a pointer reference to a memory location where the value in the register named by <register name> is to be stored.

StoreRegisterExplicit <register name>, <const value>

This instruction stores the value of register named by <register name> into the memory location specified by <const value>.

The exemplary TISA instruction set includes the following logical operations on registers:

AND <source register>, <destination register>

This operation performs a logical AND operation between the <source register> and the <destination register> and places the resulting value in the <destination register>.

OR <source register>, <destination register>

This operation performs a logical OR operation between the <source register> and the <destination register> and places the resulting value in the <destination register>.

XOR <source register>, <destination register>

This operation performs a logical XOR operation between the <source register> and the <destination register> and places the resulting value in the <destination register>.

NOT <source register>, <destination register>

This operation performs a logical NOT operation on the <source register> and places the resulting value in the <destination register>.

XORM <source register>, <mask register>, <destination register>

This operation performs a logical XOR operation between the user data register <source register> and the user data register <destination register>, comparing only those bits aligning with the user data register <mask register> bit containing a value of "1", and places the resulting value in the <destination register>. Note that uncompared bits will result in a "0" value in the <destination register>.

The exemplary TISA instruction set includes the following miscellaneous operation on registers:

NOP

A no operation opcode to be used as a filler to provide alignment in some ISA instruction sets.

The exemplary TISA instruction set includes the following instructions for extending support for streaming for an embodiment using the adjunct processor architecture:

MemoryWrite

This instruction writes to the local test memory using the following arguments: <sequence number>, <block offset (32-bit offset)>, <number of bytes to transfer>, <destination address (in specified memory block)>, <data byte(s)>.

MemoryRead

This instruction reads from the local test memory using the following arguments: <sequence number>, <block offset (32-bit offset)>, <number of bytes to transfer>, <source address (in specified memory block)>. This instruction returns a stream of data bytes tagged with the sequence number and the number of bytes being transferred.

The exemplary TISA instruction set includes the following values for scan state:

StartState, ScanState, EndState

The scan state codes include: TestLogicReset (TLR), RunTest/Idle (RTI), PauseDR (PDR), PauseIR (PIR), ScanDR (SDR), ScanIR (SIR). There is a 4-bit representation per state code, and 12 bits are used to describe the entire state transition sequence for a scan operation.

It will be appreciated, by one skilled in the art and informed by the teachings herein, that various other TISA implementations may be used with the TISA processor architectures depicted and described herein. For example, other TISA implementations may use fewer, more, and/or different registers, may use fewer, more, and/or different instruction sets, and the like, as well as various combinations thereof. In one embodiment, other TISA implementations may be utilized where different processor architectures are used, in order to provide TISA implementations better-suited to specific applications, and/or for any other suitable reasons.

As described hereinabove, use of TISA in a JTAG architecture enables scan operations to be performed at the Scan Segments Level, which allows the definition of independently controllable "scan segments" inside the overall scan path, thereby providing a flexible and powerful set of primitives that can be used to define scan operations directly in the problem space and resolve the scan operations at implementation time.

In general, JTAG operations are based on the scan operation in which all bits are scanned in serially one-by-one while at the same time bits are being scanned out serially one-by-one. This means that, in order to be able to perform a scan operation, knowledge of which value is needed for each bit in the scan chain (i.e., the input and output vectors) is required. TGTs typically provide this capability for traditional structural testing by computing the required vectors from a system model obtained through description languages such as BSDL. Additionally, formats like SVF and STAPL mirror this, as they allow the user to manipulate those vectors. While testing in this manner is sufficient for structural (and other types) of testing, testing in this manner is highly inefficient for interactive setups in which there is no real need to access the whole scan chain. The inefficiency may be seen by considering an example.

For example, consider a scan chain composed of 100 instruments, each one having 16 bits. If the user needed to write 0x1234 in the registers of the $76^{th}$ instrument in the scan chain, the TGT would need to generate the vector for the whole scan chain (100*16=1600 bits) and send it to the TAP interface to be input into the scan chain. Similarly, if the user wanted to read the associated output, the TGT would need to receive the entire 1600 bit vector before being able to extract the desired output information. In this example, the fact that a majority of the scan bits are useless is not important, as scan efficiency is not one of the goals (rather, in this example, the goal is primarily to be able to efficiently access one particular entity of the scan chain).

This type of approach is a problem at least for the following reasons: (a) there is the computational need of handling long vectors (e.g., lots of memory transfers have a high impact on performances); (b) there is a need to store the entire vector(s) in memory (which may be a problem for long chains); (c) memory storage is not limited to data inputs and data outputs, but also includes expected data, input and output mask, and the like (thereby multiplying memory requirements which are already potentially strained just from the input and output data); and (d) the transformation from instrument-vector-instrument must be made each time (which demands computational power and time).

The Scan Segments Level abstraction level is a powerful tool for providing efficient access to individual entities, or groups of entities, of the scan chain of a system under test, without any special emphasis on scan efficiency (even if, of course, still enabling it if needed).

In one embodiment, Scan Segments Level abstraction is implemented by decomposing a scan chain into a succession of segments and defining one or more scan operations on each of the segments. The scan chain is composed of a plurality of elements, and each segment includes at least one of the elements of the scan chain. The elements may be defined at many levels of the system under test (e.g., elements may be devices, instruments, registers, segments of a register, and the like, as well as various combinations thereof), and, thus, that the segments into which the scan chain is decomposed may be defined at many levels of the system under test (e.g., segments may include one or more devices, a portion of a device(s), one or more instruments, a portion of an instrument(s), one or more registers, a portion of a register(s), one or more register segments, and the like, as well as various combinations thereof). In this manner, a segment may represent the smallest control unit of the scan chain.

In one embodiment, decomposition of a scan chain into segments may be hierarchical. For example, the scan chain may be decomposed into segments, at least some of which may be composed by sub-segments, at least some of which may be composed by sub-segments, and so forth. In this manner, the hierarchical decomposition of the scan chain may be viewed as having a tree-based structure in which a segment may be composed of other segments. In one such embodiment, the segments at the leaves of the tree may be referred to as segments (in that they represent the smallest control unit of the scan chain), which the segments located above the leaves of the tree may be referred to as super-segments. It will be appreciated that, in one embodiment, one or more of the segments of the scan chain may be composed of virtual sub-segments which are controllable, but only in a manner that is transparent to the user/system. The hierarchical decomposition of a scan chain may be defined in any other suitable manner.

The use of segmentation enables definition of entities for types of segments and/or types of segment combinations. An entity is a generic description of a type of target, which is valid for and may be reused for each physical instance of that type of target. For example, an entity may define a description of a device, a group of devices, a portion of a device, an instrument, a group of instruments, a portion of an instrument, and the like, as well as various combinations thereof. Thus, since a scan chain may be decomposed such that segments of the scan chain include specific elements or combinations of elements, entities may be defined for respective segments and/or respective combinations of segments, of a scan chain. For example, where a scan chain is decomposed such that a segment includes an instrument, an entity may be defined for that type of segment (i.e., each segment including that type of instrument), such that the entity may be reused for each physical instance of that type of segment in the scan chain. Similarly, for example, where a scan chain is decomposed such that a segment includes multiple instruments, an entity may be defined for that type of segment (i.e., each segment including that type combination of instruments), such that the entity may be reused for each physical instance of that type of segment in the scan chain. This enables additional features and functions to be supported, as described below.

The use of segmentation allows an entity (i.e., a description of a type of segment under control) to be correlated with a physical protocol that is used to communicate with the entity. As a result, description languages (e.g., such as NSDL, P1687 IJTAG PDL, and the like) could be written specifically for the entity, and the connectivity description portion (e.g., the structure of the NSDL or the IJTAG HDL) would describe the ordering of the segmentation instructions.

TISA provides a reusable modularity that can be defined once for all occurrences of a particular entity type, as the TISA instructions are segment-based operations rather than model-based operations. Thus, since TISA is both modular and autonomous for the entity under test in a particular segment, TISA provides significant advantages over existing architectures.

TISA enables a direct mapping of the Test Data Register definition into a reusable and portable module that may be plugged into the execution flow at any point in the scan process, in any order that is necessary, without needing to define the entire connectivity as a static model up front as existing tools require. TISA enables integration of the port/signal interfaces that are non-scan with the scan operations as a single solution space architecture based on a unified control flow and standard computer science techniques (providing significant advantages over solutions in which native language constructs are used to provide access to non-scan operations).

TISA enables reuse of instruction sequences for multiple instances of the same entity, thereby enabling a reduction in code storage requirements in the system. For example, a generalized function, which maps to description language functions which are called by a managing program, may be written. In this example, each of the functions are methods of native language objects that represent the entity, and there may be separate instances of these objects for each entity defined in the system, but there could be a single copy of code used to communicate with each of these instances. In this manner, the native language implementation models directly control the description language used to specify the connectivity and functionality of the circuit.

In reference to the example given above, use of Scan Segments Level abstraction would enable definition of three segments as follows: segment S1 including instruments 1 through 75, segment S2 including the instrument 76, and segment S3 including instruments 77 through 100. In this manner, access to instrument 76 is greatly simplified. For example, access to instrument 76 could be obtained by making a "dummy shift" (e.g., ScanBlockZero) for segment S3, executing the instruction(s) for segment S2 (i.e., instrument 76), making another dummy shift for segment S1, and then terminating with an update. In such a sequence, access to segment S2 (i.e., to a specific instrument in the scan chain) is provided without a need of any knowledge of segment S1 or segment S3 apart from their length. It will be appreciated that this is merely one example, and, thus, that other decompositions of the 100 instrument-long chains are possible to enable access to other instruments or instrument groups.

Figure 17:
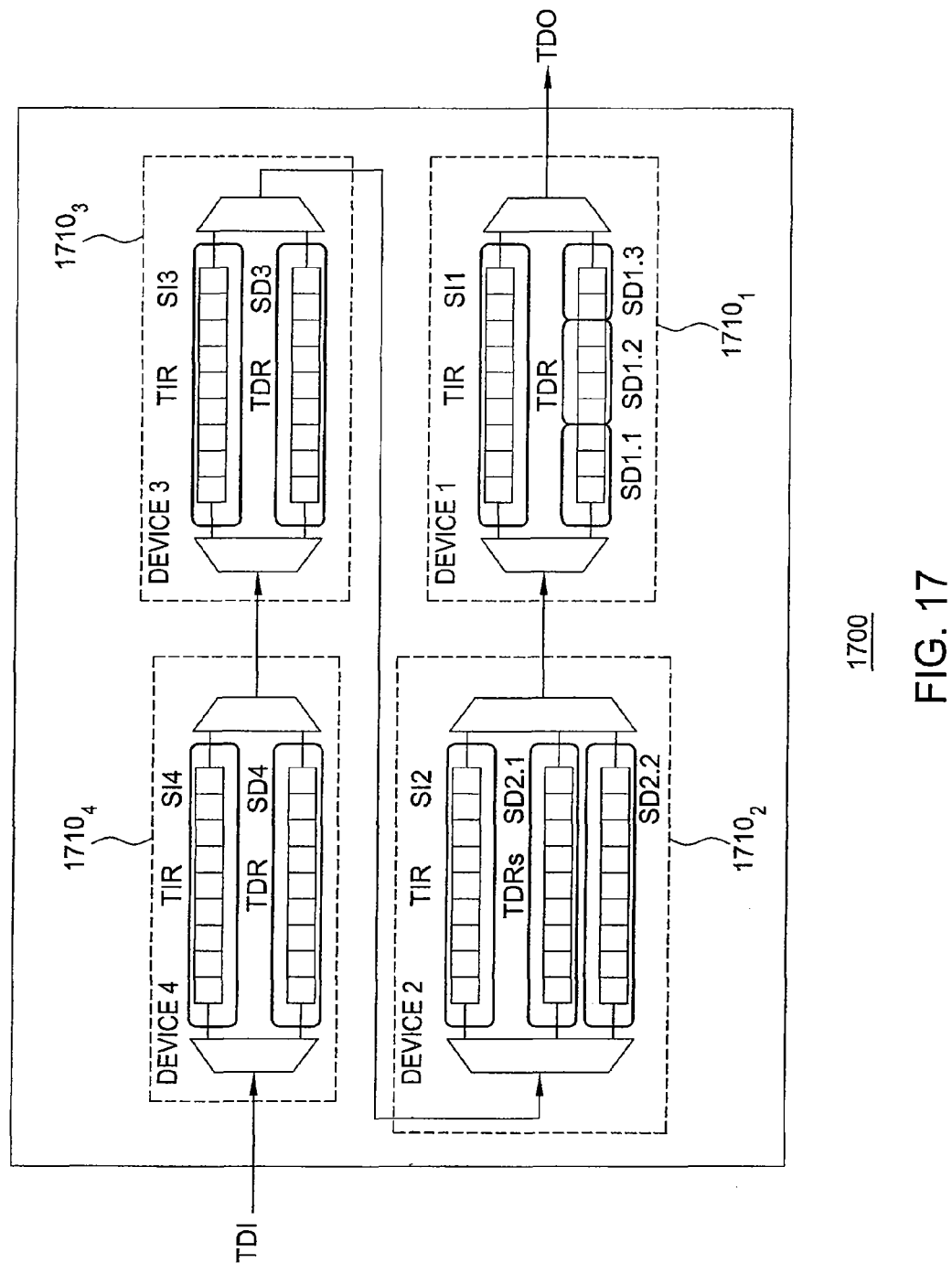
FIG. 17 depicts a high-level block diagram of a system under test, illustrating an exemplary decomposition of an exemplary scan chain of the system under test.

FIG. 17 depicts a high-level block diagram of a system under test, illustrating an exemplary decomposition of an exemplary scan chain of the system under test.

The exemplary SUT 1700 includes four devices $1710_1$-$1710_4$ (collectively, devices 1710; and denoted in FIG. 17 as Device 1, Device 2, Device 3, and Device 4, respectively). The devices 1710 are arranged serially within SUT 1700 to form a scan chain 1720. The scan chain 1720 is as follows: the TDI of the TAP is connected to the input port of device $1710_4$, the output port of device $1710_4$ is connected to the input port of device $1710_3$, the output port of device $1710_3$ is connected to the input port of device $1710_2$, the output port of device $1710_2$ is connected to the input port of device $1710_1$, and the output port of device $1710_1$ is connected to the TDO of the TAP.

In the exemplary SUT 1700, each of the devices 1710 includes (1) an input de-multiplexer providing inputs to a test instruction register (TIR) and a test data register (TDR), and (2) an output multiplexer for collecting outputs from the TIR and the TDR. The TIR and TDR of each device 1710 are parallel registers. The device $1710_3$ includes one additional TDR, such that the input de-multiplexer provides inputs to one TIR and two TDRs and collects outputs from the one TIR and the two TDRs, where the one TIR and two TDRs are all in parallel. The TIRs and TDRs each are depicted as serial shift registers, each including nine associated elements (e.g., flip-flops). In this manner, (a) the TIRs form one scan chain (denoted as an test instruction scan chain) that includes thirty-six serial elements and (b) the TDRs form another scan chain (denoted as a test data scan chain) that includes forty-five total elements and thirty-six serial elements (i.e., because the two TDRs of device $1710_2$ are in parallel).

In the exemplary SUT 1700, the test instruction scan chain has been decomposed into four segments follows: a first segment SI4 which includes the nine elements of the TIR of device $1710_4$, a second segment SI3 which includes the nine elements of the TIR of device $1710_3$, a third segment SI2 which includes the nine elements of the TIR of device $1710_2$, and a fourth segment SI1 which includes the nine elements of the TIR of device $1710_1$. In this manner, the testing system may access any of the TIRs of SUT 1700, individually or in combination, with minimal knowledge of the other TIRs of SUT 1700 (other than the number of elements of which they are composed).

In the exemplary SUT 1700, the test data scan chain has been decomposed into six serial segments (seven total segments) as follows: a first segment SD4 that includes the nine elements of the TDR of device $1710_4$; a second segment SD3 that includes the nine elements of the TDR of device $1710_3$; a third segment SD2 that includes either the nine elements of the first TDR of device $1710_2$ (denoted as sub-segment SD2.1) or the nine elements of the second TDR of device $1710_2$ (denoted as sub-segment SD2.2), where these are counted as separate segments for purposes of counting the total number of segments; and a fourth segment which is further decomposed into three serial sub-segments as follows: a first sub-segment that includes the first three elements of the TDR of device $1710_1$ (denoted as sub-segment SD1.1), a second sub-segment that includes the next four elements of the TDR of device $1710_1$ (denoted as sub-segment SD1.2), and a third sub-segment that includes the last two elements of the TDR of device $1710_1$ (denoted as sub-segment SD1.3). In this manner, the testing system may access any of the TDRs of SUT 1700 (or even sub-portions of the TDR of device $1710_1$), individually or in combination, with minimal knowledge of the other TDRs of SUT 1700 (other than the number of elements of which they are composed).

It will be appreciated that SUT 1700 of FIG. 17 is merely one example of the manner in which the scan chain(s) of a system under test may be decomposed for use in providing Scan Segments Level abstraction. Although depicted and described herein with respect to specific types, numbers, and arrangements of elements, components, and the like, it will be appreciated that a system under test for which a scan chain(s) is decomposed may be include various other types, numbers, and/or arrangements of elements, components, and the like.

As described herein, decomposition of the scan chain of a system under test enables scan operations to be defined on the segments, thereby improving testing efficiency. A method, according to one embodiment, for generating a set of instructions including scan operations for segments of a decomposed scan chain is depicted and described herein with respect to FIG. 18.

A more detailed example of scan decomposition and generation of scan segment operations is provided follows.

As a general example, consider a scan chain that includes three boards where each board includes a segment (denoted as segments A, B, and C associated with a first board, a second board, and a third board, respectively). In this example, where the scan segments are hierarchical, the segment A on the first board may be composed of a plurality of sub-segments (e.g., sub-segments $A_1$ through $A_n$), the segment B on the second board may be composed of a plurality of sub-segments (e.g., sub-segments $B_1$ through $B_n$), and/or the segment C on the third board may be composed of a plurality of sub-segments (e.g., sub-segments $C_1$ through $C_n$).

As a more specific example, following the application and the SUT, a segment could be: one or more registers inside an instrument, an instrument, a cluster of registers, one or more boards, and the like, as well as various combinations thereof.

The overall scan operation is therefore decomposed in a series of segment scan operations. As a result, all that is required in order to obtain the final scan chain operation is a series of simple atomic operations. Thus, the embodiments of Scan Segments Level abstraction, while not exclusively limited to, are especially effective in implementations in which the atomic test operations are treated like processor operations (e.g., such as in the various TISA implementations depicted and described herein, or in any other similar implementations in which atomic test operations are treated like processor operations).

In such embodiments of Scan Segments Level abstraction, the actual implementation of the Scan Segments Level scan operations may require that one or more technological constraints linked to JTAG be addressed. For example, constraints such as the need to define the state of the TAP machine and the risk of using the Pause-DR state (not always implemented), among others, may need to be addressed.

In order to identify instrument/segment outputs in the output bitstream received via the scan chain, based on the position of the instrument/segment in the scan chain, the scan chain may be treated as a first-in-first-out (FIFO) system (given its serial nature) such that the first segment that is scanned in is also the first segment that is scanned out (as it is closest to the end of the scan chain).

In order to make the SUT "experience" the sequence of scan segment operations like a single scan operation, the TCK may be frozen between segment operations. As all elements inside the scan chain are synchronous, the effect of freezing TCK in this manner is that the scan chain is frozen together with TCK.

The use of Scan Segments Level in a TISA-based testing system may be better understood by way of a few examples, In the examples that follow, assume that a system under test (SUT) is composed of three segments (denoted as A, B, and C, in that order), and that a user needs to write a value V inside of segment B.

As a first example, assume that the three segments of the system (A, B, and C) are implemented inside the same JTAG device. In this first example, once the three segments are defined in memory, the TISA operations would become:
i. Set Startstate=Run-Test-Idle, Scanstate=Endstate=ShiftDR;
ii. Set ScanLenghtField to the length of Segment A;
iii. Scan a bypass sequence into segment A;
iv. Set Startstate=Scanstate=Endstate=ShiftDR;
v. Set ScanLenghtField to the length of Segment B;
vi. Scan V into segment B;
vii. Set Startstate=Scanstate=ShiftDR, Endstate=Run-Test-Idle;
viii. Set ScanLenghtField to the length of Segment C;
ix. Scan a bypass sequence into segment C.

With respect to the first example, keeping the TAP Finite State Machine (FSM) in the ShiftDR state ensures that there is no update on the scan chain. This may be seen from the first example, in which keeping the TAP FSM in the ShiftDR state from step (i) to step (ix) ensures that there is no update on the scan chain, given that the UpdateDR State will be reached only once leaving ShiftDR.

Further with respect to the first example, the scan clock TCK is active only during the scan operations (i.e., steps (iii), (vi), and (ix)), and is frozen in the remaining states. The effect is that the SUT, from the point of view of the SUT based on operations synchronous with TCK, will see steps (iii), (vi), and (ix) as a continuous bitstream.

Further with respect to the first example, the "bypass sequence" is a property of the scan segment, and can be, for instance, a given sequence (all zeros, all ones, or any other suitable sequence), or "don't care", where it is up to the TGT to decide such sequence.

As a second example, assume that the three segments of the system (A, B, and C) are implemented on different JTAG devices (in one or more cards). In this second example, once the three segments are defined in memory, the TISA operations would become:
i. Set Segment A states: StartState=RunTest/Idle, ScanState=ShiftIR, EndState=ShiftIR (gateTCK indicator);
ii. Set Segment A ScanLengthField to length of Segment A IR;
iii. Run ScanBlock with BYPASS instruction pattern for Segment A;
iv. Set Segment B states: StartState=ShiftIR, ScanState=ShiftIR, EndState=ShiftIR (gateTCK indicator);
v. Set Segment B ScanLengthField to length of Segment B IR;
vi. Run ScanBlock with EXTEST instruction pattern for Segment B;
vii. Set Segment C states: StartState=ShiftIR, ScanState=ShiftIR, EndState=RunTest/Idle;
viii. Set Segment C ScanLengthField to length of Segment C IR;
ix. Run ScanBlock with BYPASS instruction pattern for Segment C;

x. Set Segment A states: StartState=RunTest/Idle, ScanState=ShiftDR, EndState=ShiftDR (gateTCK);

xi. Set Segment A ScanLengthField to length of Segment A selected DR (1 bit BYPASS DR);

xii. Run ScanBlock with BYPASS data pattern for Segment A;

xiii. Set Segment B states: StartState=ShiftDR, ScanState=ShiftDR, EndState=ShiftDR (gateTCK);

xiv. Set Segment B ScanLengthField to length of Segment B selected DR (n bit BSR DR to pins);

xv. Run ScanBlock with EXTEST data pattern for Segment B;

xvi. Set Segment C states: StartState=ShiftDR, ScanState=ShiftDR, EndState=RunTest/Idle;

xvii. Set Segment C ScanLengthField to length of Segment C selected DR (1 bit BYPASS DR);

xviii. Run ScanBlock with BYPASS data pattern for Segment C.

In comparing the first example and the second example, it will be understood that the additional complexity associated with the second example comes from the need to use the Instruction Register (IR) of each JTAG device to select/deselect the segments. In that case, unused segments are directly taken out of the chain by putting the related JTAG device in the BYPASS mode of the 1149.1 standard (as indicated in steps (iii) and (xvii) of the second example).

It will be appreciated that all compositions of the above two examples are possible, with any number of segments defined on one or more JTAG devices. It will be further appreciated that the above-two examples are merely examples provided for the purpose of illustrating use of the Scan Segments Level for testing a system under test, and, thus, that embodiments in which the Scan Segments Level is used for testing a system under test are not intended to be limited by these examples.

In such embodiments, the actual sequence of TISA instructions can have multiple origins, including one or more of the following: (1) the TISA instructions may be statically computed by the TGT, in which case, each time the user wants to access a segment, the entire chain must be scanned (it will be appreciated that, while this solution is not optimized for scan time, it can be useful for embedded systems with limited computational resources and little or no time constraints); (2) the TISA instructions may be issued by a software scheduler, which receives access requests and composes them into scan operations; and/or (3) the TISA instructions may be issued by a hardware scheduler (e.g., such as, but not limited to, what is done for instruction reordering and bypass in some high-performance processors). It will be appreciated that TISA instructions associated with Scan Segments Level control may be issued in any other suitable way, which may include a combination of the methods described above and/or one or more other suitable methods which may be used in place of or in addition to one or more of the methods described above.

The Scan Segments Level abstraction level is a powerful tool for handling dynamic topologies, such as the ones proposed by the IEEE P1687 standard and other dynamic topologies. If a section of the scan chain can be taken in and out the active scan path (e.g., using an SIB cell proposed by the IEEE P1687 standard or any other suitable hierarchy-enabling component(s)), that section can be marked as one (or more) segments. The testing scheduler then has knowledge, from the system state, as to whether or not this segment(s) is active, and, therefore, if the segment should be included in the TISA instruction scheduling. It will be appreciated by those skilled in the art and informed by the teachings herein that this principle also may be used for other dynamic elements, such as hot-swap boards (e.g., by detecting their presence from a status register) or any other suitable dynamic elements.

Figure 18:
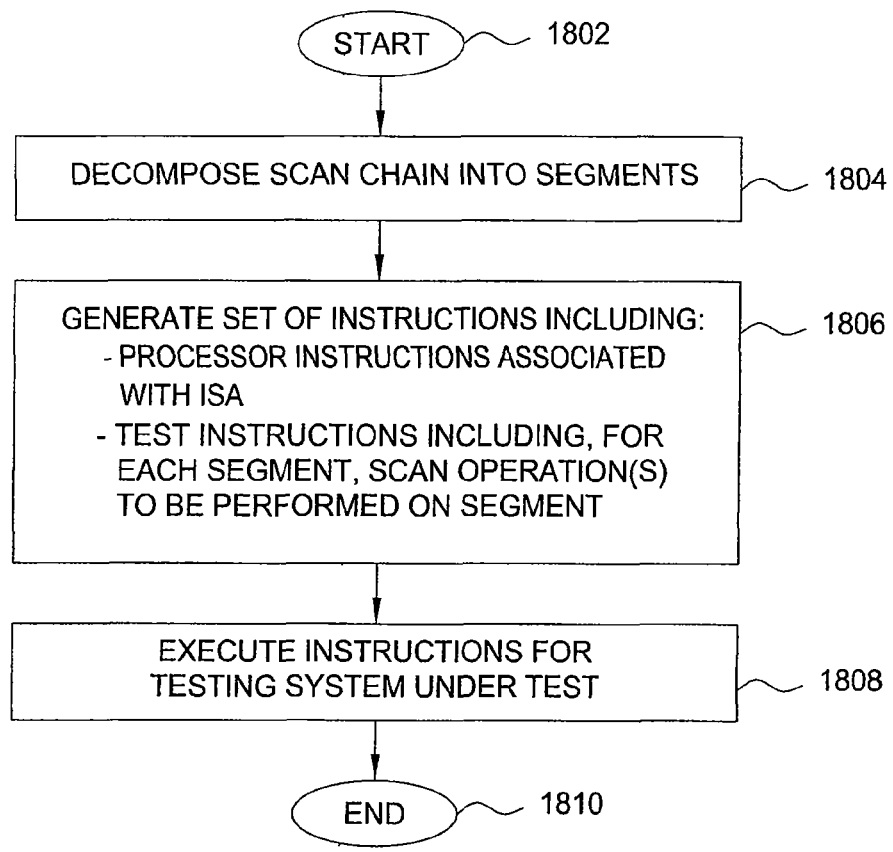
FIG. 18 depicts a high-level block diagram of one embodiment of a method for testing a portion of a system under test via a scan chain of the system under test using Scan Segment Level abstraction of the scan chain.

FIG. 18 depicts a high-level block diagram of one embodiment of a method for testing a portion of a system under test via a scan chain of the system under test using Scan Segments Level abstraction of the scan chain.

Although primarily depicted and described herein as being performed serially, at least a portion of the steps of method 1800 may be performed contemporaneously, or in a different order than depicted and described with respect to FIG. 18.

At step 1802, method 1800 begins.

At step 1804, the scan chain is decomposed into a plurality of segments. The scan chain is composed of a plurality of elements, and each segment includes at least one of the elements of the scan chain. The scan chain may be decomposed into segments in any suitable manner, as described hereinabove. As described herein, decomposition of the scan chain into segments may be applied anywhere in the development flow (e.g., by the test developer, by the test generation tool, by an embedded circuit model, and the like).

At step 1806, a set of instructions is generated. The set of instructions includes processor instructions associated with an ISA and test instructions for testing the portion of the system under test. The test instructions include, for each of the segments of the scan chain, at least one scan operation to be performed on the segment. The test instructions may be any type of test instructions, such as conventional test instructions, test instructions of a TISA, and the like, and, thus, may be generated in any suitable manner. The set of instructions may be generated in any suitable manner (e.g., in a manner the same as or similar to as depicted and described hereinabove respect to At step 1808, the set of instructions is executed for testing the portion of the system under test. The set of instructions may be executed in any suitable manner, which may depend on the type of instructions of the set of instructions.

At step 1810, method 1800 ends.

Although primarily depicted and described herein with respect to embodiments in which embodiments of TISA are used to enable scan operations to be performed at the Scan Segments Level, it will be appreciated that one or more of the Scan Segments Level embodiments depicted and described herein also may be provided in environments using TISA-like instructions architectures, non-TISA instruction architectures and/or non-TISA testing environment implementations, and the like.

Although references are made herein to "the TISA" for purposes of describing the enhanced system testing capabilities enabled by exemplary embodiments of TISAs which may be formed and utilized as depicted and described herein, it will be appreciated that many different TISAs may be formed depending on various factors, such as one or more of the ISA of the processor for which the TISA is formed, characteristics of the SUT for which the TISA is formed, characteristics of the test algorithm the TISA is supposed to execute, and the like, as well as various combinations thereof. Thus, references made herein to "the TISA" also may be read more generally as "a TISA" in that many different types of TISAs may be formed.

Figure 19:
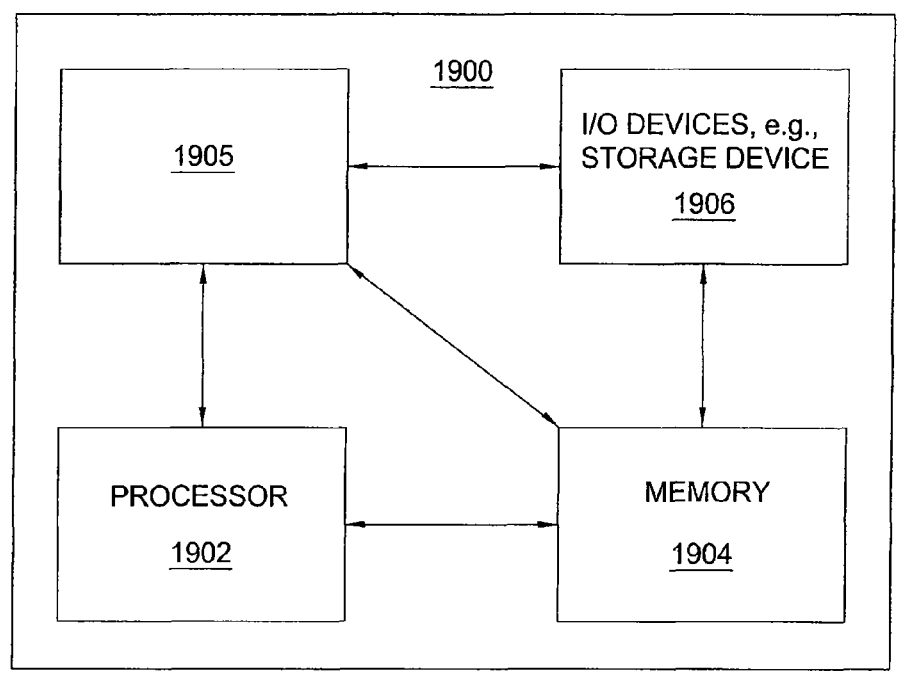
FIG. 19 depicts a high-level block diagram of a computer suitable for use in performing functions described herein.

FIG. 19 depicts a high-level block diagram of a computer suitable for use in performing the functions described herein. As depicted in FIG. 19, computer 1900 includes a processor element 1902 (e.g., a central processing unit (CPU) or other suitable processor(s)), a memory 1904 (e.g., random access memory (RAM), read only memory (ROM), and/or any other suitable types of memory), system testing module/process 1905 adapted for performing system testing functions depicted and described herein, and various input/output devices 1906 (e.g., a user input device (such as a keyboard, a keypad, a mouse, and the like), a user output device (such as a display, a speaker, and the like), an input port, an output port, a receiver, a transmitter, and storage devices (e.g., a tape drive, a floppy drive, a hard disk drive, a compact disk drive, and the like)).

It should be noted that system testing functions depicted and described herein may be implemented in software and/or in a combination of software and hardware, e.g., using a general purpose computer, one or more application specific integrated circuits (ASIC), and/or any other hardware equivalents. In one embodiment, system testing process 1905 can be loaded into memory 1904 and executed by processor 1902 to implement and/or support implementation of at least a portion of the system testing functions described hereinabove. Thus, system testing process 1905 (including associated data structures) can be stored on a computer readable storage medium or carrier, e.g., RAM memory, magnetic or optical drive or diskette, and the like.

It is contemplated that some of the steps discussed herein as software methods may be implemented within hardware, for example, as circuitry that cooperates with the processor to perform various method steps. Portions of the functions/elements described herein may be implemented as a computer program product wherein computer instructions, when processed by a computer, adapt the operation of the computer such that the methods and/or techniques described herein are invoked or otherwise provided. Instructions for invoking the inventive methods may be stored in fixed or removable media, transmitted via a data stream in a broadcast or other signal bearing medium, and/or stored within a memory within a computing device operating according to the instructions.

Although various embodiments which incorporate the teachings of the present invention have been shown and described in detail herein, those skilled in the art can readily devise many other varied embodiments that still incorporate these teachings.

What is claimed is:

1. An apparatus for use in testing at least a portion of a system under test via a Test Access Port (TAP), comprising:
   a memory storing a set of instructions of a test instruction set architecture; and
   a processor configured to execute the set of instructions of the test instruction set architecture for testing at least a portion of the system under test via the TAP;
   wherein the set of instructions of the test instruction set architecture comprises:
      a first set of instructions comprising a plurality of instructions of an Instruction Set Architecture (ISA) supported by the processor, wherein the ISA comprises one or more operation codes (opcodes); and
      a second set of instructions comprising a plurality of test instructions associated with the TAP;
      wherein the instructions of the first set of instructions and the instructions of the second set of instructions are integrated to form thereby the set of instructions of the test instruction set architecture.

2. The apparatus of claim 1, wherein the instructions of the ISA supported by the processor are generated using at least one computer science software file.

3. The apparatus of claim 1, wherein the instructions of the ISA supported by the processor are generated using at least one pre-processed computer science software file generated by pre-processing at least one computer science software file.

4. The apparatus of claim 1, wherein the test instructions associated with the TAP are generated using at least one description file associated with the system under test.

5. The apparatus of claim 1, wherein the test instructions associated with the TAP are generated using at least one description file associated with the system under test and at least one test operation file, wherein the at least one test operation file is generated by pre-processing at least one computer science software file.

6. The apparatus of claim 1, wherein instructions from the first set of instructions are adapted for use in controlling execution of instructions from the second set of instructions.

7. An apparatus for testing at least a portion of a system under test via a Test Access Port (TAP), comprising:
   a memory storing a set of instructions of a test instruction set architecture; and
   a processor configured to execute the set of instructions of the test instruction set architecture for testing at least a portion of the system under test via the TAP;
   wherein the set of instructions of the test instruction set architecture comprises:
      a first set of instructions comprising a plurality of instructions of an Instruction Set Architecture (ISA) supported by the processor, wherein the ISA comprises one or more operation codes (opcodes); and
      a second set of instructions comprising a plurality of test instructions associated with the TAP;
      wherein the instructions of the first set of instructions and the instructions of the second set of instructions are integrated to form thereby the set of instructions of the test instruction set architecture.

8. A computer processor for testing a system under test via a Test Access Port (TAP), the computer processor comprising circuitry configured to process instructions according to a test instruction set architecture having semantics that enable interaction with the system under test via the TAP, the test instruction set architecture comprising a plurality of instructions of a first type and a plurality of instructions of a second type, wherein the first type of instructions comprise instructions of an instruction set architecture (ISA) supported by the computer processor, wherein the ISA comprises one or more operation codes (opcodes), wherein the second type of instructions comprise test instructions for testing the system under test via the TAP.

9. A method for adapting an Instruction Set Architecture (ISA) flow of a processor to support iesting of at least a portion of a system under test by the processor via u Test Access Port (TAP), the method comprising:
   using at least one processor for:
      generating a first set of instructions comprising ISA instructions supported by the processor, wherein the ISA instructions comprise one or more operation codes (opcodes);
      generating a second set of instructions comprising test instructions associated wilh the TAP;
      integrating the first set of instructions and the second set of instructions to form thereby a set of Test Instruction Set Architecture (TISA) instructions; and
      performing at least one of storing the TISA instructions, executing the TISA instructions, or propagating the TISA instructions.

10. The method of claim 9, wherein generating a first set of instructions comprising ISA instructions supported by the processor comprises:
   generating a program model by compiling at least one computer science software file; and processing the program model to generate thereby the first set of instructions comprising ISA instructions supported by the processor.

11. The method of claim 9, wherein generating a first set of instructions comprising ISA instructions supported by the processor comprises:
   generating at least one pre-processed computer programming source file by processing at least one computer science software file; and
   compiling the at least one pre-processed computer programming source file for generating ISA instructions and placeholders for test instructions.

12. The method of claim 9, wherein generating a second set of instructions comprising test instructions associated with the TAP comprises:
   generating a circuit model by compiling at least one description file associated with the system under test; and
   processing the circuit model to generate thereby the second set of instructions comprising test instructions associated with the TAP.

13. The method of claim 9, wherein generating a second set of instructions comprising test instructions associated with the TAP comprises:
   receiving at least one test operation file generated during pre-processing of at least one computer science software file to form at least one pre-processed computer science software file;
   generating a circuit model by compiling at least one description tile associated with the system under test and the at least one test operation file;
   processing the circuit model to generate thereby a set of test generation tool test operations; and
   processing the lest generation tool test operations to form thereby the second set of instructions comprising test instructions associated with the TAP.

14. The method of claim 9, wherein the first and second sets of instructions are integrated by a TISA composer, wherein integrating (he first set of instructions and the second set of instructions to form thereby a set of TISA instructions comprises:
   receiving the first set of instructions and placeholders at the TISA composer;
   receiving the second set of instructions at the TISA composer; and
   processing, by the TISA composer, the first and second sets of instructions to form thereby the set of TISA instructions, wherein the set of TISA instructions is formed by substituting the placeholders from the first set of instructions with related instructions from the second set of instructions.

15. The method of claim 9, wherein integrating the first set of instructions and the second set of instructions to form thereby a set of TISA instructions comprises:
   compiling the first set of instructions and the second set of instructions using at least one algorithm to form thereby a program model; and
   processing the program model using at least one algorithm to form thereby the set of TISA instructions.

16. A method for generating instructions adapted for use in testing a system under test via a Test Access Port (TAP), comprising:
   using at least one processor for generating a set of combined instructions, the set of combined instructions comprising:
      a first set of instructions comprising a plurality of instructions of an Instruction Set Architecture (ISA), wherein the ISA comprises one or more operation codes (opcodes); and
      a second set of instructions comprising a plurality of test instructions associated with the TAP; and
   performing at least one of storing the combined set of instructions, executing the combined set of instructions, or propagating the combined set of instructions.

17. The method of claim 16, wherein generating the set of combined instructions comprises:
   generating the first set of instructions using at least one computer science software file;
   generating the second set of instructions using at least one description file associated with the system under test; and
   combining the first and second sets of instructions to form thereby the combined set of instructions.

18. The method of claim 16, wherein the instructions from the first set of instructions are adapted for use in controlling execution of the instructions from the second set of instructions.

19. The method of claim 16, wherein generating the set of combined instructions comprises:
   generating a program model by compiling at least one computer science software file, the computer science software file including at least one call;
   generating a first set of instructions and at least one computation request using the program model, wherein the at least one computation request is generated using the at least one call included in the at least one computer science software file;
   generating a circuit model by compiling at least one system description file associated with the system under test;
   generating a second set of instructions using the circuit model and the at least one computation request;
   combining the first and second sets of instructions to form thereby a combined set of instructions, wherein instructions from the first set of instructions are adapted for use in controlling execution of instructions from the second set of instructions; and performing at least one of storing the combined set of instructions or executing the combined set of instructions.

20. The method of claim 16, wherein the set of combined instructions is generated using a software compiler and a test generation tool, wherein generating the set of combined instructions comprises:
   generating at least one test operation description file and at least one pre- processed computer science software file using at least one computer science software file;
   generating a circuit model of the system under test using at least one system description file associated with the system under lest and the at least one test operation description file;
   generating a set of test operations using the circuit model of the system under test, wherein test operations from the set of test operations are described using a set of test primitives defined by the test generation tool, wherein the set of test primitives comprises test operations adapted for use in testing the system under test;
   translating the set of test operations into a set of test instructions by translating the test primitives of the set of test operations into test instructions adapted for use in combination with software instructions of an instruction set architecture; generating a program model by compiling the at least one pre-computer science software file and the set of test instructions;

generating a combined set of instructions using the program model, the combined set of instructions comprising software instructions and test instructions from the set of test instructions; and performing at least one of storing the combined set of instructions or executing the combined set of instructions.

\* \* \* \* \*